United States Patent [19]

Ema

[11] Patent Number: 5,274,599
[45] Date of Patent: Dec. 28, 1993

[54] FLASH-TYPE NONVOLATILE SEMICONDUCTOR MEMORY HAVING PRECISE ERASING LEVELS

[75] Inventor: Taiji Ema, Kawasaki, Japan

[73] Assignee: Fujitsu Limited, Kawasaki, Japan

[21] Appl. No.: 49,399

[22] Filed: Apr. 21, 1993

[30] Foreign Application Priority Data

Apr. 22, 1992 [JP] Japan .................. 4-102676

[51] Int. Cl.⁵ ............................................ G11C 13/00
[52] U.S. Cl. ........................................................ 365/218
[58] Field of Search .................... 365/189.01, 218, 900, 365/182

[56] References Cited

U.S. PATENT DOCUMENTS 5,065,364  11/1991  Atwood et al. .................... 365/900

FOREIGN PATENT DOCUMENTS 1-259556  10/1989  Japan .
1-294297  11/1989  Japan .
4-3395    1/1992   Japan .
4-6698    1/1992   Japan .
4-13295   1/1992   Japan .
4-21998   1/1992   Japan .
4-275457  10/1992  Japan .

*Primary Examiner*—Terrell W. Fears
*Attorney, Agent, or Firm*—Nikaido, Marmelstein, Murray & Oram

[57] ABSTRACT

A flash-type nonvolatile semiconductor memory having a precise erasing level is disclosed. The memory of the present invention includes a plurality of source lines arranged in parallel to bit lines in correspondence with columns of a cell matrix, a plurality of level judging circuits arranged at each bit line and a plurality of source line switches arranged at each source line. In an erasing operation, memory cells are erased so as to not generate over-erased cells, every selected memory cell is simultaneously tested whether or not it has a threshold less than a upper limit of an object range, and only unsufficiently erased memory cells are further erased in a re-erasing step by being controlled with the source line switches.

11 Claims, 19 Drawing Sheets

Fig. 21A (WRITING)
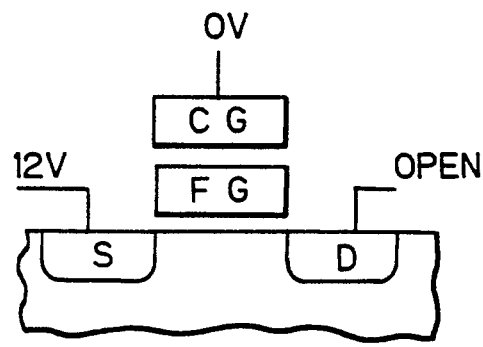
Fig. 21B (READING)
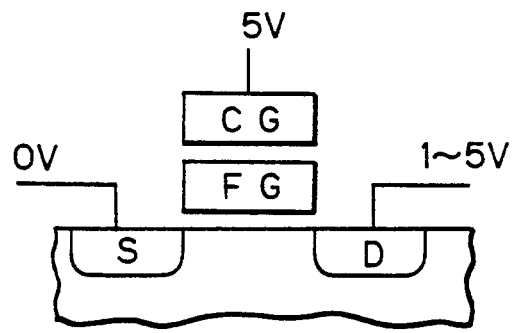
Fig. 21C (ERASING)
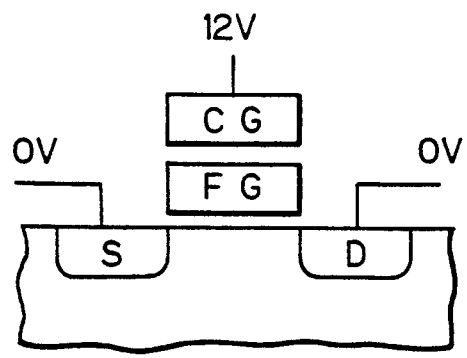

FLASH-TYPE NONVOLATILE SEMICONDUCTOR MEMORY HAVING PRECISE ERASING LEVELS

BACKGROUND OF THE INVENTION

1. Field of the Invention

The present invention relates to an electrically erasable nonvolatile semiconductor memory of the batch erasure type (hereinafter referred to as a flash memory), particularly to a flash memory in which an erasing level of each memory cell can be precisely controlled within a narrow range.

2. Description of the Related Art

An electrically erasable programable read only memory ($E^2$ PROM) is a typical electrically erasable nonvolatile memory. In an $E^2$ PROM, each memory cell is composed of two transistors, one of which is a selection transistor, and the other is a memory transistor having a floating gate. A threshold level with which the memory transistor turns ON when predetermined voltages are applied to the memory transistor changes whether electrons are filled in the floating gate, therefore, the ON and OFF conditions of each memory cell respectively correspond to logic values of "0" and "1". Generally, the logic value "0" corresponds to the OFF condition and the logic value "1" corresponds to the ON condition, and, in this specification, it is assumed that this relation is available. In a typical $E^2$ PROM, an N-channel transistor is used as a memory cell. In this case, electrons are injected into the floating gate when the logic value "0" is written in the $E^2$ PROM, and electrons are not injected into the floating gate when the logic value "1" is written, namely, no operation is carried out when the logic value "1" is stored. Usually, an operation to inject the electrons into the floating gate is called a writing operation. Conversely, electrons are withdrawn from the floating gate when stored data are erased. An operation to withdraw the electrons from the floating gate is called an erasing operation.

In the $E^2$ PROM, each memory cell can be independently read, written and erased. However, since each memory cell is composed of two transistors, an integration of the $E^2$ PROM is lower than that of a EPROM. A flash-type $E^2$ PROM was proposed as a new $E^2$ PROM having a better integration. In the following, the flash-type $E^2$ PROM is called "flash memory".

Each memory cell of the flash memory is composed of one transistor which has a control gate, a floating gate, a drain region and a source region. In the flash memory, memory cells are arranged in a matrix, and word lines and bit lines are respectively arranged to correspond to rows and columns of the matrix. The control gates of the memory cells included in one row of the matrix are connected to the corresponding word line, and drain regions of the memory cells included in one column of the matrix are connected to the corresponding bit line. Source regions of all memory cells are connected to source lines which are commonly connected.

In the flash memory, when a memory cell is read or written, voltages corresponding to read and write operations are applied to a word line and a bit line connected to the selected memory cell, and other voltages are applied to other word lines and bit lines.

Then, all source lines are grounded whether or not they are selected. Therefore, a reading operation and a writing operation to each memory cell can be independently carried out. However, when the memory cell is erased, a selected word line is grounded and a voltage such as 6 V is applied to other word lines, a high volatge is commonly applied to the source areas via the commonly connected source lines, and all bit lines are opened whether or not they are selected. Therefore, memory cells are erased by at least a unit of the word line. In a typical flash memory, memory cells are erased by a block unit larger than a word line unit. Generally, an erasing operation requires a longer time than another operations, therefore, a total erasing time of the flash memory becomes very long if all memory cells are erased one by one. In an application of the flash memory, the total erasing time is important and it is required to be reduced, therefore, the erasing operation by a block unit can become an advantage.

In the reading operation, a sense amplifier detects a current in a bit line connected to the selected memory cell. A current flows from the selected bit line to the selected memory cell when the selected memory cell is ON, and a current does not flow when the selected memory cell is OFF. However, if one or more memory cells connected to the selected bit lines except the selected memory cell are ON, the current flows through those memory cells whether the selected memory cell is ON or OFF, therefore, the selected memory cell cannot be correctly read. Consequently, the erased memory cells are required to be ON when it is selected and also required to be OFF when it is not selected. This means that thrshold levels of the erased memory cell are required to be within a predetermined range.

Each memory cell has production variations of the characteristics of the erasing operation. The characteristic variations in the erasing operation cause differences of threshold levels of memory cells after the erasing operation because the erasing operation is carried out by a block unit. Namely, after the erasing operation, the memory cell of a high erase efficiency has a low threshold level and the memory cell of a low erasing efficiency has a high threshold level.

Therefore, there may exist erased memory cells having threshold levels over the predetermined range after the erasing operation. In the conventional flash memory, a verify operation is carried out to confirm the erasing operation. In the verify operation, a voltage less than a normal reading voltage is applied to the selected word line. When there exist unsufficiently erased memory cells, the erasing operation is repeated.

By this verify operation, it is confirmed that all erased memory cells turn ON when they are selected, namely, it is confirmed that all erased memory cells have threshold levels less than the upper level of the predetermined range. However, by the above verify operation, it is not confirmed that all erased memory cells do not turn ON when they are not to be selected, namely, it is not confirmed that all erased memory cells have threshold levels more than the lower level of the predetermined range. The erased memory cell having a threshold level less than the lower level of the predetermined range is called an over-erased memory cell. If there exist over-erased memory cells, the reading operation is disturbed.

In the writing operation, threshold levels of the written memory cells have variations. However, the written memory cell is only required to be OFF whether or not they are selected, therefore, there is no problem when all written memory cells have threshold levels more than a predetermined level.

In electrically erasable nonvolatile memories disclosed in Japanese Unexamined Patent Publication (Kokai) Nos. 1-294297, 4-3395, 4-13295 and 4-21998, levels of the bit lines or a channel current are detected during the erasing operation, and the erasing operation are stopped when those detecting values become predetermined values. In these ways, the erased levels can be more precisely controlled, however, counterplans to reduce the variations of the erased levels are not disclosed.

In electrically erasable nonvolatile memories disclosed in Japanese Unexamined Patent Publication (Kokai) No. 4-6698, the erased memory cells are discriminated whether their threshold levels are within a predetermined range, and when there exist over-erased memory cells, the writing operation and the erasing operation are carried out in a period shorter than those of the normal operations. In this way, the variation of the erased levels is reduced. However, because the erasing operation is carried out to all memory cells and a writing characteristic does not always correspond to an erasing characteristic, it is difficult to reduce the variation of the erased levels to within a narrow range. Further, the device of this document requires circuits for reading operations at different threshold levels.

In the electrically erasable nonvolatile memories disclosed in the above documents, the memory cells of the whole device or the memory cells of the whole erasing block unit are simultaneously erased. Namely, memory cells cannot be erased one by one. However, if memory cells can be erased one by one, it is easy to control the erased levels of all memory cells within a narrow range.

In Japanese Unexamined Patent Publication (Kokai) Nos. 1-259556 and 4-275457, new types of erectrically erasable nonvolatile memories are disclosed. In these memories, each memory cell includes only one memory transistor, and memory cells can be read, written and erased one by one. These memories have word lines, pairs of bit lines and source lines arranged perpendicular to said word lines, and a matrix of memory cells arranged at intersections of the word lines and the pairs of the bit lines and the source lines. Each of the memory cells includes a control gate, a floating gate, a drain region and a source region. The control gate is connected to one of the word lines, a drain region is connected to one of the bit lines, and a source region is connected to one of the source lines.

The source lines are not commonly connected, and an erasing voltage can be selectively applied to the source lines. Therefore, the memory cells can be erased one by one. Although the above documents does not disclose the reduction of the variation of the erased levels, the erased levels of the memory cells can be easily controlled within a predetermined range by respectively controling each erased level of the memory cells.

However, as described above, the erasing operation requires a longer time than another operations. Therefore, when all memory cells are erased one by one, there arises a problem that a total erasing time of these memories becomes very long. In an application of the flash memory, the total erasing time is important.

SUMMARY OF THE INVENTION

The object of the present invention is to realize a flash memory in which erased levels of all memory cells can be within a narrow range and an erasing operation can be carried out in a short time.

According to the present invention, an electrically erasable nonvolatile semiconductor memory of a batch erasure type includes a plurality of word lines, a plurality of pairs of bit lines and source lines arranged perpendicular to the word lines, a matrix of memory cells arranged at intersections of the word lines and the pairs of the bit lines and the source lines, each of the memory cells including a floating gate, a control gate connected to one of the word lines, a first diffusion portion connected to one of the bit lines and a second diffusion portion connected to one of the source lines, a plurality of level judging circuits respectively arranged at the bit lines, each level judging circuit detects whether or not a selected memory cell connected to the selected word line turns ON when read voltages are applied to the selected memory cells and stores a switching signal corresponding to the detected result, and a plurality of source line switch circuits respectively arranged at the source lines, each of which circuits switches the source line to be connected to an erasing voltage source or to the ground according to the switching signal of the corresponding level judging circuit. And then, in an erasing operation, a first erasing step in which no memory cell is over-erased, a sensing process to detect and store a state of every selected memory cells in every level judging circuit, a re-erasing step to selectively apply erasing high voltages to source lines by being controlled with each source line switch circuit, a repeating process to repeat the sensing process and the re-erasing process until every selected memory cells connected to the selected word line turn ON when read voltages are applied to the selected memory cells, and a proces to carry out the sensing process, the re-erasing process and the repeating process to every word line in a block of memory cells to which the erase operation being carried out.

BRIEF DESCRIPTION OF THE DRAWINGS

The present invention will be more clearly understood from the description as set forth below with reference to the accompanying drawings, wherein:

FIGS. 21A to 21C are diagrams respectively showing voltage conditions of a writing operation, a reading operation and an erasing operation in a flash memory of a seventh embodiment;

DESCRIPTION OF THE PREFERRED EMBODIMENTS

Before describing embodiments of the present invention, a cell construction and reading, writing and erasing operations of a conventional flash memory are explained.

Figure 1A:
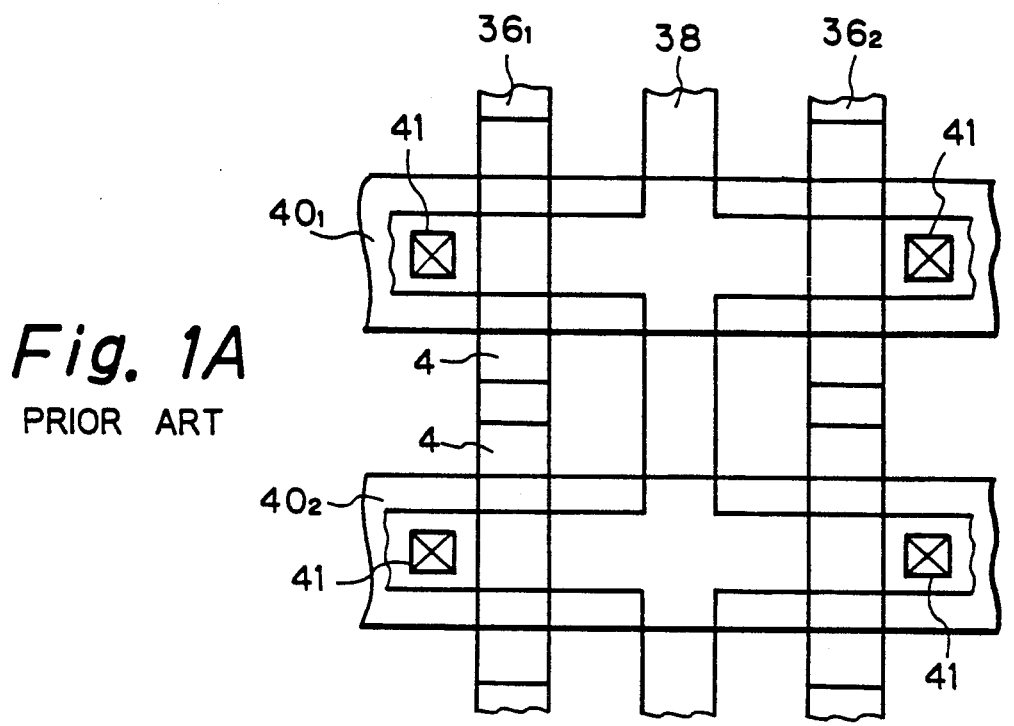
FIGS. 1A to 1C are diagrams showing a constitution of a memory cell matrix of a conventional flash memory.
Figure 1B:
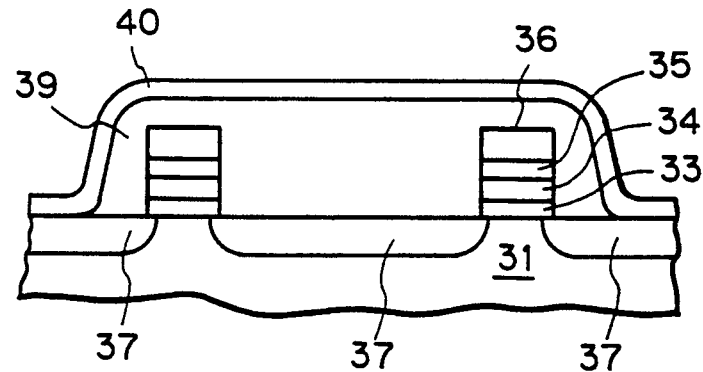
Figure 1C:
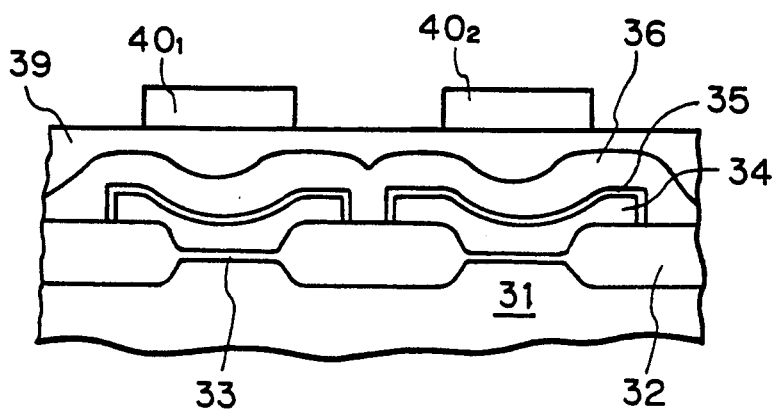
Figure 2:
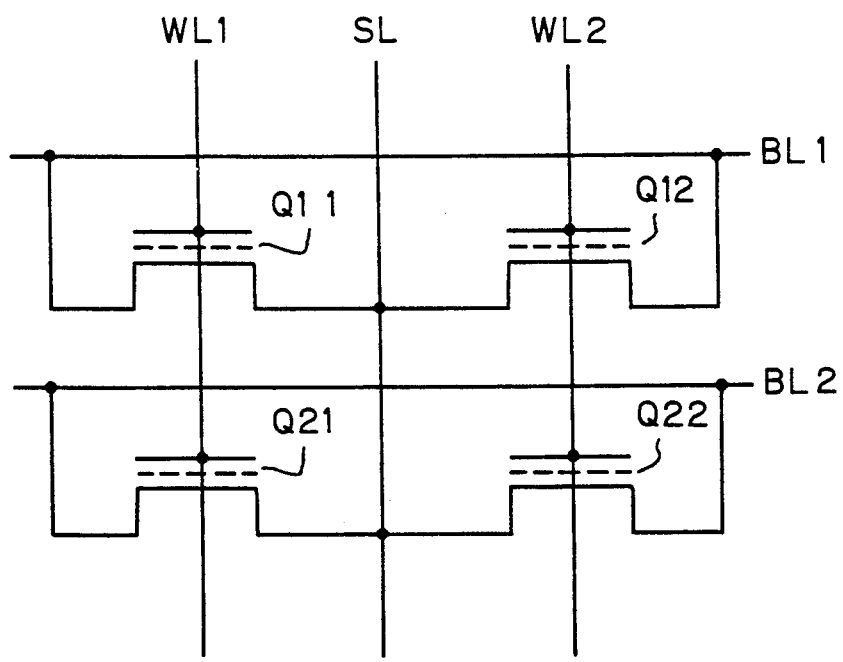
FIG. 2 is an equivalent circuit diagram of the memory cell matrix of FIG. 1.

FIGS. 1A, 1B and 1C is a diagram for illustrating a cell construction of a conventional flash memory, and FIG. 2 is an equivalent circuit diagram of the flash memory shown in FIG. 1. FIG. 1A is a plan view, FIG. 1B is a cross section diagram perpendicular to word lines (WLs), and FIG. 1C is a cross section diagram parallel to word lines.

In these figures, reference numeral 31 designates a P-type semiconductor layer, 32 designates field oxide films, 33 designates gate oxide films, 34 designates floating gates, 35 designates control gate insulation films, 36 designates control gates, $36_1$ and $36_2$ designate word lines, 37 designates diffusion regions, 38 designates a source line of diffusion region, 39 designates a layer insulation film, 40, $40_1$ and $40_2$ designate bit lines, and 41 designates contact holes.

For example, this conventional flash memory is made as in the following.

A field oxide film 32 which makes out an element formation area is formed on the P-type semiconductor layer 31, the gate oxide film 33 is formed at this element formation area, the floating gates (FGs) 34 are made by forming patterned polycrystalline silicon film on the gate oxide film 33, the control gate insulation films 35 are formed on the floating gates 34, and the control gates (CGs) 36 which become word ($36_1$, $36_2$) lines are made by forming patterned polycrystalline silicon film on the control gate oxide films 35. Further, the diffusion regions 37 are made by injecting phosphorous with masking the control gates 36 and the floating gates 34, the source line 38 is formed on one side of the diffusion regions 37, the layer insulation film 39 is formed on them, the bit lines 40 ($40_1$, $40_2$) which are connected to the other side of the diffusion regions 37 via the contact holes 41 are formed on the layer insulation film 39.

FIG. 2 shows an equivalent circuit of the memory cells shown in FIG. 1. In FIG. 2, Q11, Q12, Q21 and Q22 designate memory cells, WL1 and WL2 designate word lines, BL1 and Bl2 designate bit lines, and SL designates a source line. In practice, a plurality of source lines exist between pairs of word lines, and they are commonly connected.

Figure 3A:
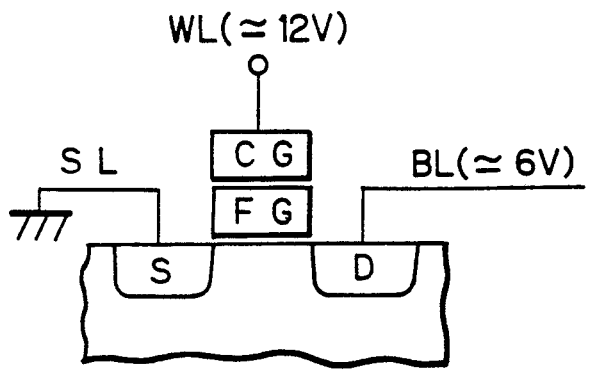
FIGS. 3A to 3C are diagrams respectively showing voltage conditions of a writing operation, a reading operation and an erasing operation in a conventional flash memory.
Figure 3B:
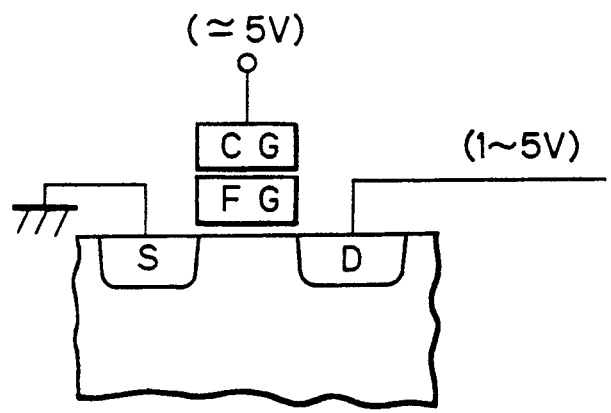
Figure 3C:
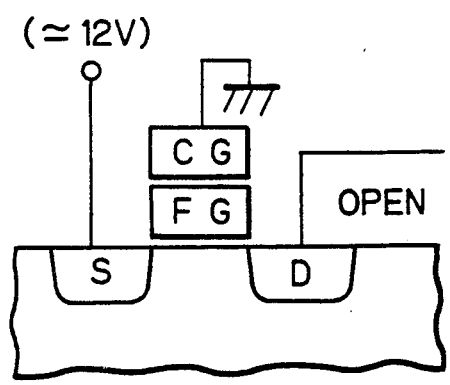

FIGS. 3A, 3B and 3C respectively show voltages applied to respective regions of a selected memory cell in a writing operation, a reading operation and an erasing operation. These operations are explained with reference to FIG. 3A to 3C.

In the writing operation, 6 V is applied to the drain (D) of the selected memory cell via the selected bit line, 12 V is applied to the control gate (CG) of the selected memory cell via the selected word line, and 0 V is applied to the source (S) of every memory cell via the commonly connected source lines. 0 V is applied to another bit lines and another word lines. Therefore, voltages shown in FIG. 3A are applied to the selected memory cell.

In the selected memory cell, a channel is formed at a surface of the P-type semiconductor layer 31 by a field produced by a potential between the drain and the source. In this channel, electrons flows from the source to the drain with high energies. These electrons are called hot electrons. A part of the electrons are injected into the floating gate (FG) through the gate oxide film. The injected electrons can be held infinitely. The memory cells are fundamentally N-channel MOSFETs, those threshold levels increase by injecting the electrons into the floating gate. The two states of whether or not electrons filled the floating gate correspond to logic values. When a logic value corresponding to a state that the electrons do not fill the floating gate is written, voltages shown in FIG. 3A are not applied to memory cells except the selected memory cell. Therefore, voltages unlike those in FIG. 3A, for example 0 V, are applied to the selected bit line.

In other memory cells apart from the selected memory cell, a state to inject electrons into the floating gates is not established, therefore, the writing operation is not carried out. Consequently, threshold levels of those memory cells are kept unchanged.

In the reading operation, 1 to 5 V is applied to the drain (D) of the selected memory cell via the selected bit line, 5 V is applied to the control gate of the selected memory cell via the selected word line, and 0 V is applied to the source (S) of every memory cell via the commonly connected source lines. 0 V is applied to another bit lines and another word lines. Therefore, voltages shown in FIG. 3B are applied to the selected memory cell.

In this operation, the selected memory cell turns ON when electrons are not in the floating gate, and it does not turn ON when electrons fill the floating gate.

When the selected memory cell turns ON, a current flows from the selected bit line to the source line (namely, ground). Therefore, a sense amplifier detects whether the current flows at the bit line. Other memory cells do not turn ON regardless of whether electrons are filled in the floating gate. However, as described above, over-erased memory cells turn ON when they are not selected. When over-erased memory cells are connected to the selected bit line, a current flows at the selected bit line via the over-erased memory cell regardless of the state of the selected memory cell.

In the erasing operation, 12 V is applied to the source (S) of every memory cell via the source line, 0 V is applied to the control gates of every memory cells via the word lines, and every bit line is held at floating state. Therefore, every memory cell is in the condition shown in FIG. 3C.

When voltages shown in FIG. 3C are applied, a high voltage is applied between the floating gate (FG) and the source (S), then, electrons in the floating gate are withdrawn to the source line as a Fowler-Nordheim current. In this way, every memory cell become to have a state that electrons are not in the floating gate, namely, stored data is erased.

Both drain region and source region are diffusion regions and they are shown to be symmetric to the gate regions in FIG. 1A and 1B. However, in practice, a process to enhance a hot carrier generating efficiency is adapted to the drain region, and a process to enhance an withstand voltage is adapted to the source region. The process to enhance a hot carrier generating efficiency and the process to enhance an withstand voltage are reverse processss to increase or decrease a concentration gradient of the impurity material. Therefore, although the drain region and the source region are symmetric, the drain region and the source region cannot be exchanged in the operations. Consequently, an erasing operation to selectively erase memory cells cannot be carried out by a procedure that the source line is opened, and a high voltage (12 V) is selectively applied to the bit lines.

Nextly, embodiments of the present invention are described.

Figure 4:
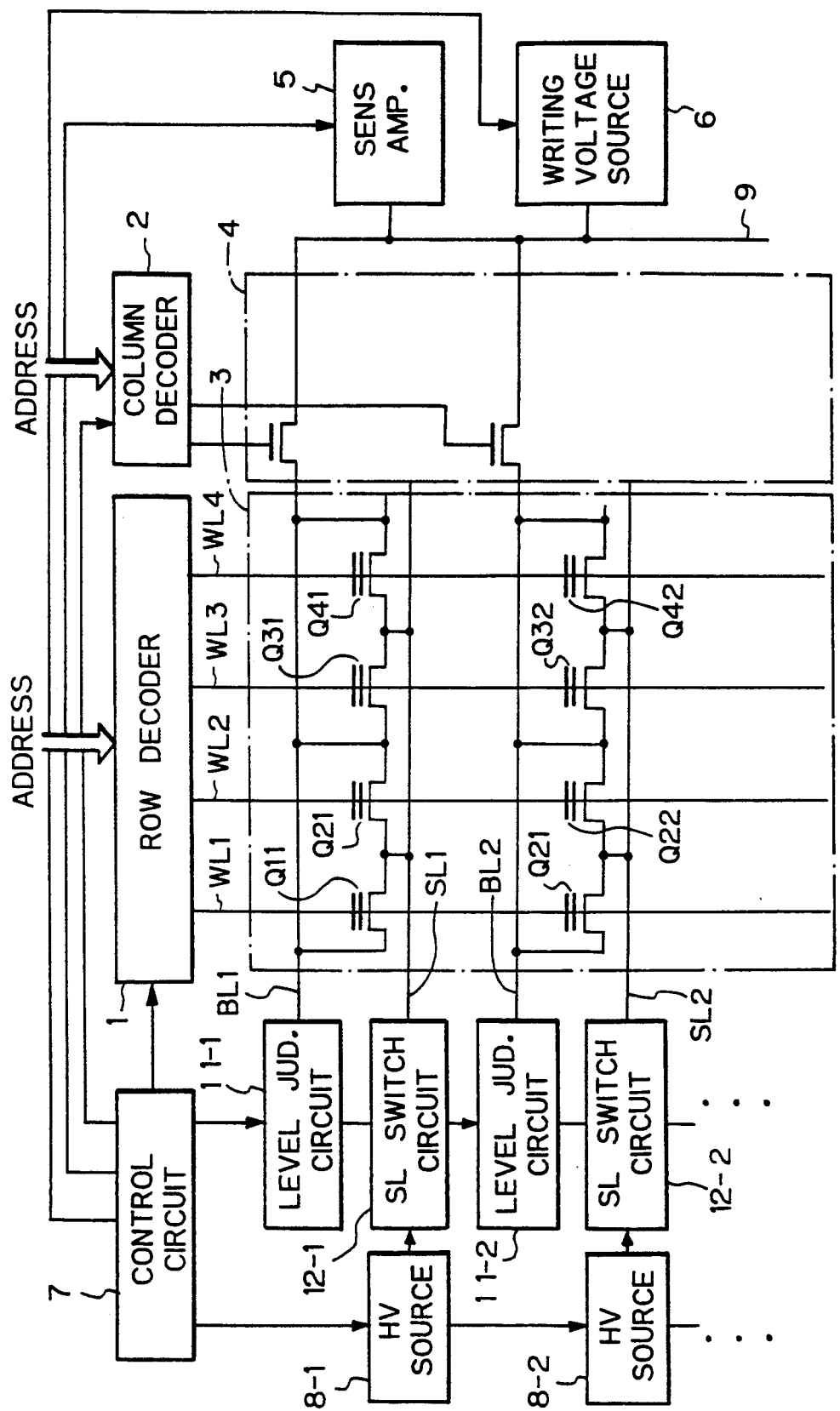
FIG. 4 is a block diagram showing a total constitution of a flash memory of a first embodiment.
Figure 5:
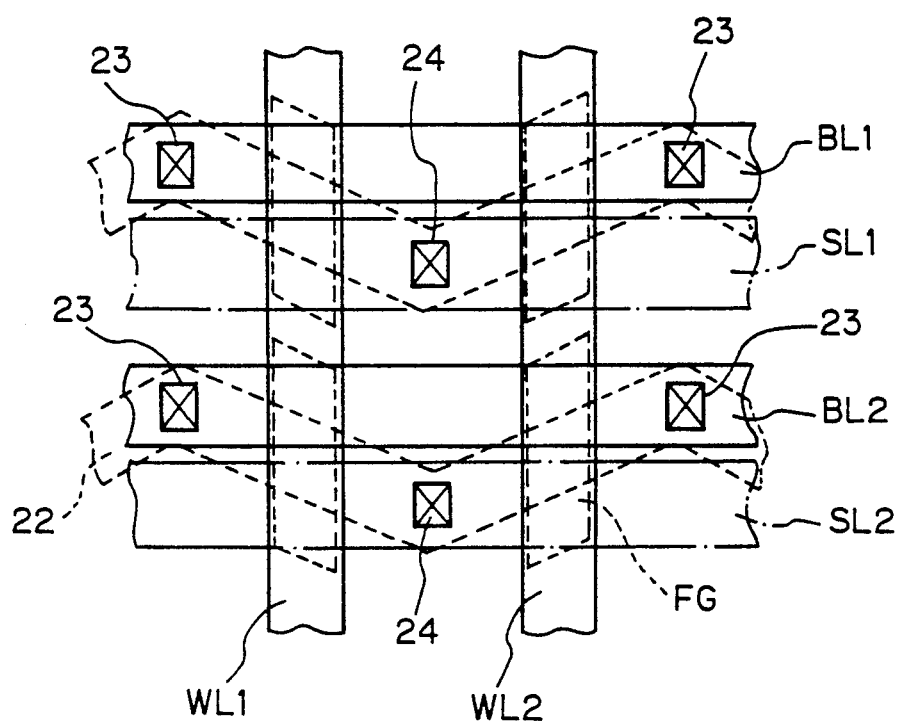
FIG. 5 is a diagram showing a constitution of a memory cell matrix of the flash memory of the first embodiment.
Figure 6:
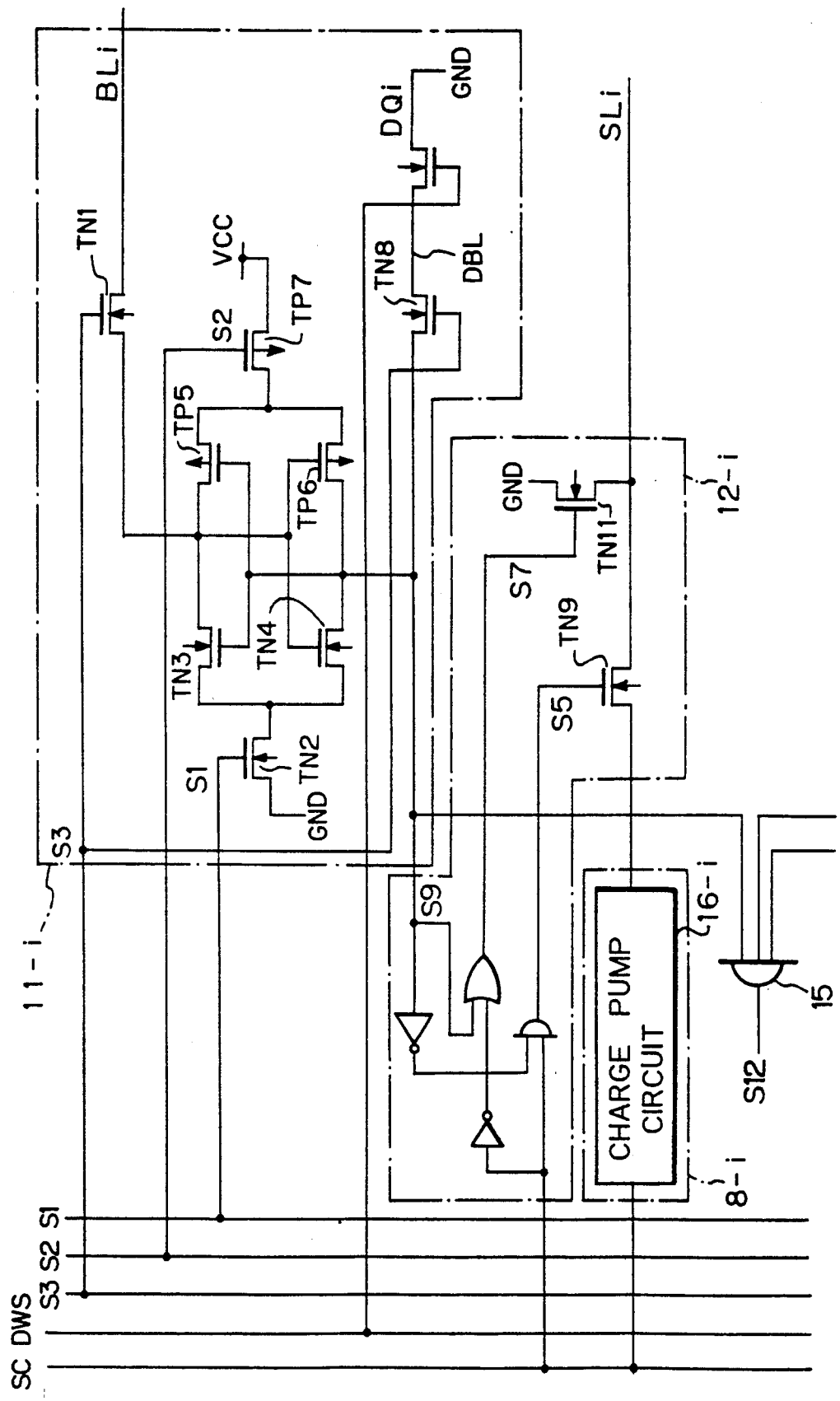
FIG. 6 is a circuit diagram of a level judging circuit and a source line switch circuit of FIG. 4.
Figure 7:
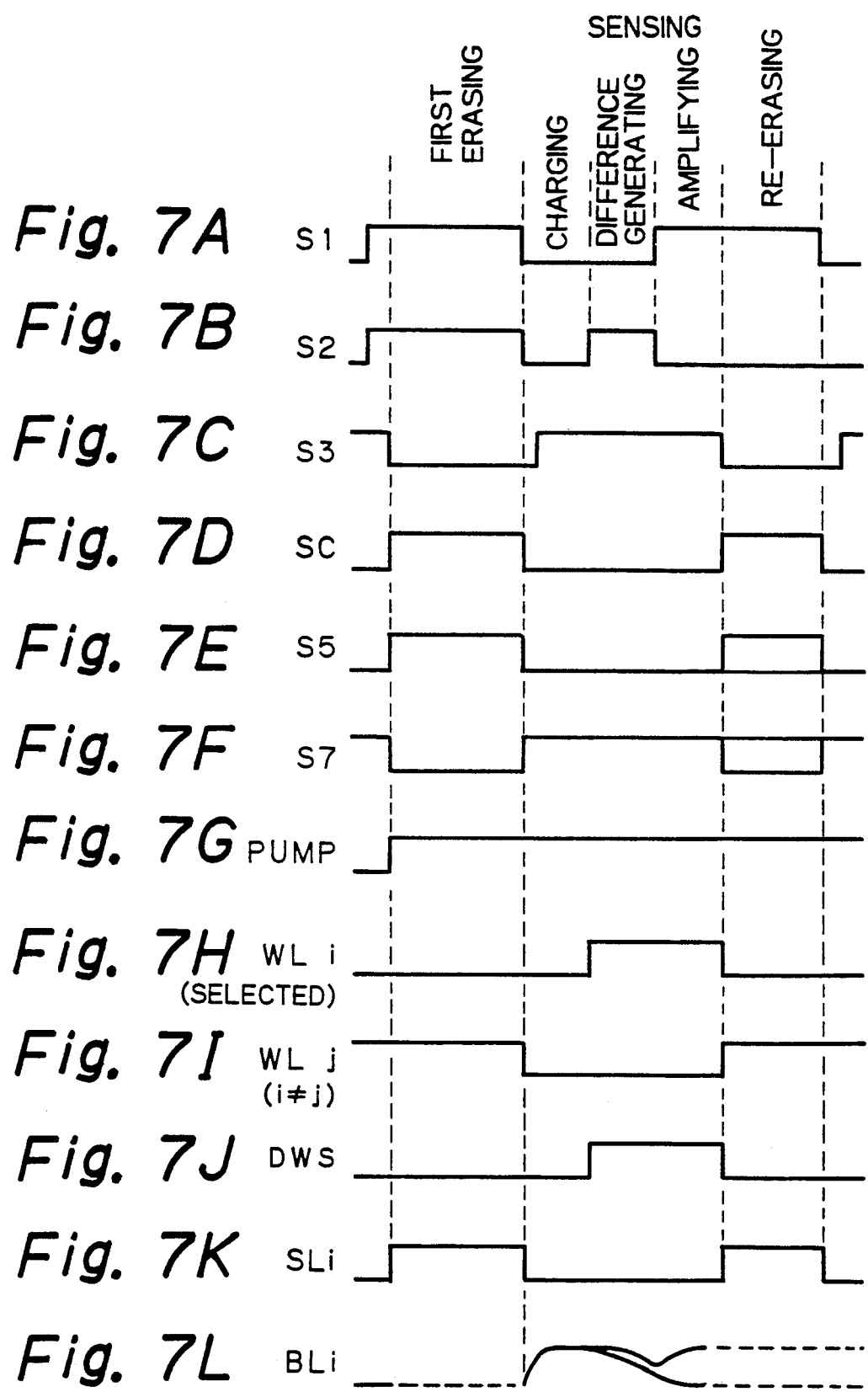
FIGS. 7A to 7L are time-charts showing control signals and a potential change of a bit line in an erasing operation of the first embodiment.

FIG. 4 is a total consitittution diagram of a flash memory of a first embodiment, FIG. 5 is a plan view of a matrix portion of the memory cells of FIG. 4, and FIG. 6 is an equivalent circuit diagram of the memory cell matrix.

In FIG. 4, reference numeral 1 designates a row decoder, 2 designates a column decoder, 3 designates a matrix of memory cells having constructions described above, 4 designates an array of bit line selection switches (Y-switchs Y1,Y2, . . .), 5 designates a sense amplifier, 6 designates a writing voltage circuit, 7 designates a control circuit, 8-i designates an erasing high voltage circuit, 9 designates a common bit line, 11-i (i=1,2, . . .) designates a level judging circuit, and 12-i (i=1,2, . . .) designate a source line switch circuit. Further, Qij (i, j=1,2, . . .) designates memory cells, WLi (i=1,2, . . .) designates a word line, Bli (i=1,2, . . .) designates a bit line, and SLi (i=1,2, . . .) designates a source line.

In FIG. 5, reference numeral 21 designates a P-type semiconductor substrate, 22 designates diffusion regions, 23 designates first contact holes and 24 designates second contact holes. WL1, WL2, Bl1, Bl2, SL1, SL2 are same to those of FIG. 4. As shown in FIG. 5, since the pairs of the bit lines and the source lines are arranged in parallel and the diffusion regions 22 on which memory cells are formed are formed so as to overlap both lines, the dffusion regions 22 are formed in zigzags as shown in FIG. 5. A cross section obtained according to the zigzag diffusion region is almost same to that of FIG. 1B. The floating gates FG are formed on the dffusion regions 22 via the gate oxide films. Further, the control gates are formed on the floating gates FG via the control gate oxide films. The control gate forms the word line WL with another control gates formed in a direction of a gate width. At the diffusion regions of both sides of the control gate on the semiconductor substrate, N-type diffusion regions corresponding to the drain region and the source region are formed.

Further, the bit lines BL1, Bl2 are formed on the layer insulation films each of which are formed to cover a whole memory cells. The bit lines cross the word lines WL1, WL2, and the bit lines overlapping with the zia-zag diffusion regions. One diffusion region of both sides of each gate region is connected to one of the bit lines via the first contact hole 23 of the first layer insulation film. Further, the second layer insulation film is formed on the first insulation film and the bit lines BL1, Bl2. The source lines SL1, SL2 are formed to be in parallel to the bit lines BL1, BL2 on the second layer insulation film. The other diffusion region of both sides of each gate region is connected to one of the source lines SL1, SL2 via the contact hole 24 formed through the first and second insulation layer.

The consitittution of FIG. 4 is almost same to that of the conventional flash memory except that the source lines are arranged in parallel to the bit lines, a number of the source lines SL1, SL2, . . . is same to that of the bit lines Bl1, Bl2, . . . , and the level judging circuits 11-1, 11-2, . . . and the source line switch circuits 12-1, 12-2, . . . are included. In the conventional flash memory, the source lines are arranged in parallel to the word lines, and the source lines are commonly connected to the erasing high voltage source 8. Further, the E$^2$ PROMs disclosed in Japanese Unexamined Patent Publication (Kokai) Nos. 1-259556 and 4-275457 have same constructions of memory cells shown in FIG. 5, however, the level judgement circuits and the source line switch circuits are not included, and a means to respectively control potentials of the source lines is included.

As shown in FIG. 4, a pair of the level judging circuits and the source line switch circuits is arranged at each pair of the bit lines and the source lines. Every level judging circuit and source line switch circuit respectively have same circuit constitutions.

Operations of constituents except the level judging circuit 11-i, the source line switch circuit 12-i and the control circuit 7 are same to those of the conventional flash memory, therefore, explanations of those operations are omitted. The control circuit 7 is different from that of the conventional flash memory in that it outputs control signals shown later.

FIG. 6 is a circuit diagram of the level judging circuit 11-i, the source line switch circuit 12-i and the erasing high voltage source 8-i of FIG. 4.

As shown in FIG. 6, the level judging circuit 11-i includes a flip-flop circuit composed of N-channel transistors TN3, TN4 and P-channel transistors TP5, TP6. This flip-flop circuit is connected to the ground via a N-channel transistor TN2 and connected to the voltage source VCC via a P-channel transistor TP7. The voltage source VCC outputs 5 V. Control signals S1 and S2 are respectively applied to gates of TN2 and TP7. A first output node of the flip-flop circuit is connected to the bit line BLi via a N-channel transistor TN1, and a second output node is connected to a dummy bit line DBLi via a via a N-channel transistor TN8. Control signal S3 is applied to gates of TN1 and TN8. The dummy bit line DBLi is connected to a dummy transistor cell DQi.

A control signal DWS is applied to a gate of the dummy transistor cell DQi. The dummy transistor cell DQi has a predetermined threshold level.

The source line switch circuit 12-i includes two N-channel transistors TN9 and TN 11, and a gate circuit. TN9 is a transfer transistor connected between the source line SLi and the erasing high voltage source 8-i, and a control signal S5 is applied to a gate of TN9. TN11 is a reset transistor connected between the source line SLi and the ground GND, and a control signal S7 is applied to a gate of TN11. The gate circuit generates S5 and S7 from an output signal of the second output node of the flip-flop and a signal SC which is high only during the erasing operation.

The erasing high voltage source 8-i includes a charge pump circuit 16-i which generates an erasing high voltage from a normal voltage source output. In this embodiment, the charge pump circuit 16-i has an well-known constitution.

Reference numeral 15 designates an AND gate. Signals of second nodes of the flip-flop circuits are input to the AND gate 15 which outputs a signal S12. By checking S12, it can be known whether every memory cell connected to the selected word line is erased.

The control signals S1, S2, S3, SC and DWS are supplied from the control circuit 7.

In the reading and writing operations, all level judging circuits are cut off from the bit lines by setting S3 to 0 V, and all source lines are grounded by setting SC to 0 V. Therefore, in the flash memory of this embodiment, the reading operation and the writing operation are carried out in same procedures as those of the conventional flash memory.

FIGS. 7A-7L are time-charts of the erasing operation of this embodiment. With reference to FIGS. 4, 6 and 7A-7L, the erasing operation is described.

The erasing operation is composed of a first erasing step, a sensing step and a re-erasing step. These steps are simultaneously adapted to every bit line and source line.

Before the first erasing step, TN2 turns ON by setting S1 to 5V, and TP7 turns OFF by setting S2 to 5 V.

By this, potentials of two output nodes of the flip-flop circuit slowly decrease to 0 V since the output nodes are connected to the ground via TN2 and high-resistance channels of TN3, TN4. A signal S9 is a potential of the second output node of the flip-flop, and it is composed with SC in the gate circuit and applied to the gate of TN11. IN the erasing operation, SC is "High", therefore, TN11 turns OFF, and the source line SLN is cut off from the ground.

In the first erasing step, TN1 and TN8 turn OFF by setting S3 and S4 to 0 V. By this, the bit line BLi is cut off from the level judging circuit 11-i. At the same time, TN9 turns ON by setting SC to 12 V. By this, the source line SLi is connected to the charge pump circuit 16-i and the source line SLi is charged up to 12 V. The row decoder 1 applies 0 V to the selected word line WLi and applies 6 V to another word lines WLj (j is any integer except i). In this way, an erasing operation is carried out to memory cells connected to the selected word line WLi. The duration of this erasing step is determined so that no memory cell is over-erased. Therefore, some memory cells, having threshold levels more than the upper limit of an object range, will not be erased.

The sensing step is composed of a charging step, a difference generating step and an amplifying step. In the charging step, TN2 turns OFF and TP7 turns ON by changing S1 and S2 to 0 V. Potentials of the first and second output nodes of the flip-flop circuit increase to 5 V since these nodes are connected to the voltage source VCC via TP7 and high-resistance channels of TP5, TP6. Therefore, S7 becomes 5 V, TN11 turns ON, and the source line SLN becomes 0 V. At this time, TN9 may turn OFF by setting SC to 0 V, however, if the ON resistance of TN11 is sufficiently smaller than that of TN9, the source line SLi becomes 0 V without turning TN9 OFF. Then, the row decoder 1 applies 0 V to all word lines. TN1 and TN8 turn ON by setting S3 and S4 to 5 V. By this, the bit line BLi is connected to the flip-flop circuit.

At this time, the outputs of the flip-flop are 5 V, therefore, the bit line BLi is charged up to 5 V. The row decoder 1 applies 0 V to every word lines, TP7 turnes OFF by setting S2 to 5 V. In this way, the bit lines are cut off from the level judging circuits, the ground and the voltage source VCC and become floating.

In the difference generating step, the row decoder 1 applies 5 V to the selected word line WLi and applies 0 V to another word lines. At this time, DWS is also changed to 5 V. By this, each memory cell connected to the selected word line WLN is read, and a current does not flow in a bit line when the memory cell having a threshold more than 5 V is connected to the bit line, and a current flows in a bit line when the memory cell having a threshold less than 5 V is connected to the bit line. When the current flows, a potential of the bit line decreases. Since a threshold level of the dummy cell DQi is determined to 1.5 V, a potential of the dummy bit line DBLi also decreases.

When the threshold level of the memory cell is larger than 1.5 V, a current of the dummy bit line DBLi is larger than that of the bit line, therefore, the potential of the dummy bit line DBLi decreases more than that of the bit line. In the same way, when the threshold level of the memory cell is smaller than 1.5 V, the potential of the bit line decreases more than that of the bit line. This means that a difference of the potentials between the bit line BLi and the dummy bit line DBLi changes according to a relation whether or not the threshold level of the selected memory cell is larger than that of the dummy cell DQi, i.e. 1.5 V. Since the bit line BLi and the dummy bit line DBLi are respectively connected to two output nodes of the flip-flop circuit and the flip-flop circuit is in a floating state, a difference of potentials between two output nodes of the flip-flop circuit becomes large.

In the amplifying step, TN2 and TP7 turn ON by setting S1 to 5 V and S2 to 0 V. By this, the flip-flop circuit is activated, and a potential of one output node becomes to 5 V and a potential of other output node becomes to 0 V according to the states of output nodes at that time. Namely, a potential of one output node having a larger potential than that of the other when TN2 and TP7 turn ON becomes to 5 V, and a potential of the other output node becomes to 0 V. This means that the difference of the potentials between two output nodes is amplified.

In this way, the signal S9 from the second output node of the flip-flop circuit becomes 0 V when the selected memory cell has a potential smaller than 1.5 V, and the signal S9 becomes 5 V when the selected memory cell has a potential larger than 1.5 V. Therefore, when the signal S9 is 0 V, the memory cell connected to the selected word line is sufficiently erased. Further, when every S9 of memory cells connected to the selected word line is 0 V, the erasing operation relating to the memory cells connected to the selected word line is finished.

Every signal S9 is input to the AND gate 15, therefore, when the output signal S12 of the AND gate 15 is "High", every memory cell connected to the selected word line is sufficiently erased.

The re-erasing step is carried out only when there exists one or more memory cell having a threshold level larger than 1.5 V. In the re-erasing step, TN1 and TN8 turn OFF by setting S3 and S4 to 0 V. BY this, every bit line BLi is cut off from the flip-flop circuit, and every bit line becomes in floating state. The states of the flip-flop circuits are maintained because no signal is applied to the output nodes. Then, the row decoder 1 applies 0 V to the selected word line and 6 V to another word lines, TN9 turns ON by setting SC to 12 V. In this way, the source line SLi is connected to the charge pump circuit 16-i. At this time, when S7 is 0 V, TN11 turns OFF and the erasing high voltage is supplied to the source line SLi. Namely, when the selected memory cell connected to the bit line BLi is not suffiently erased, the erasing high voltage is supplied to it and the erasing operation is carried out to it. However, when the selected memory cell connected to the bit line BLi is suffiently erased, S7 becomes to 5 V and TN11 turns ON. As described above, the ON resistance of TN9 is sufficiently larger than that of TN11, therefore, the source line becomes to 0 V and the erasing voltage is not supplied to the source line SLi. Consequently, the erasing operation is not carried out to a memory cell connected to this source line SLi. In this way, it is automatically controlled whether or not the re-erasing operation is carried out to each memory connected to the selected word line.

Figure 8:
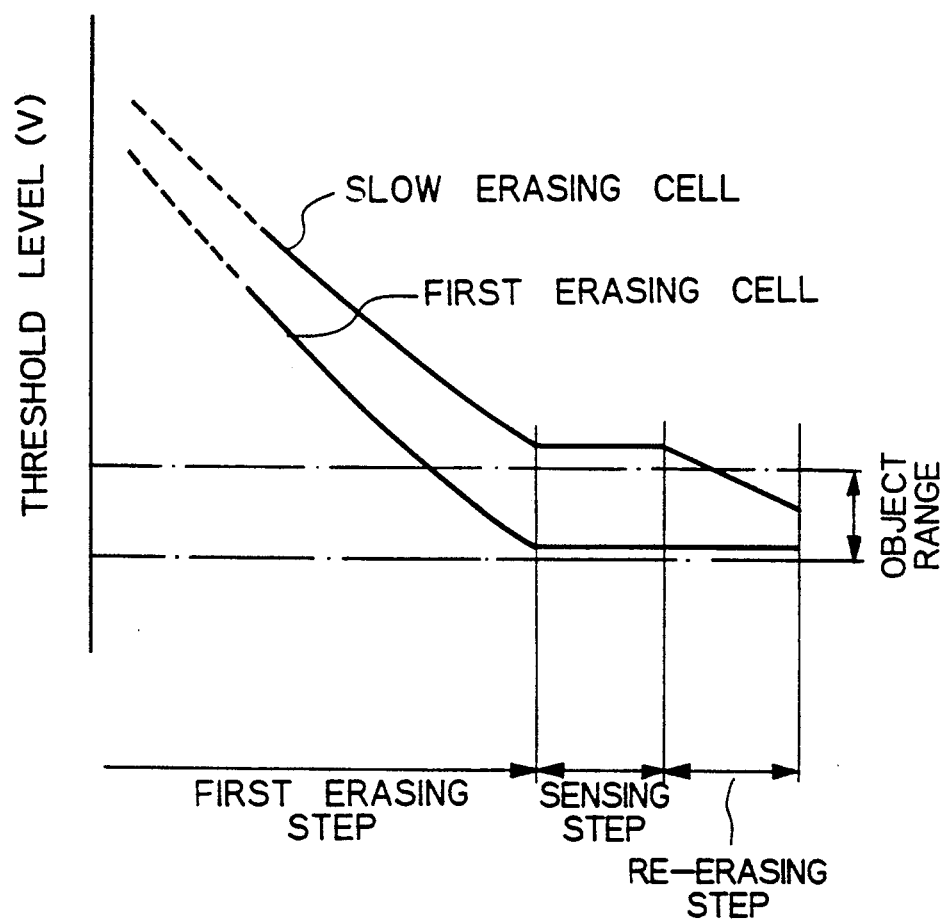
FIG. 8 is a graph showing changes of threshold levels of memory cells in the first embodiment.

FIG. 8 is a schematic graph showing changes of threshold levels of memory cells in the erasing operation of this embodiment. In the first easing operation, every memory cell connected to the selected word line is erased, and threshold levels of the memory cells decrease. The memory cells have variations of the erasing characteristic, therefore, as shown in FIG. 8, threshold levels of the memory cells after the first erasing operation have variations. A threshold level of a fast erasing memory cell is less than that of a slow erasing memory cell. A duration of the first erasing operation is determined so that every threshold level does not exceed a lower limit of the object range of the erased level. Therefore, there exists no over-erased memory cell, however, there can exist memory cells having threshold levels more than an upper limit of the object range.

In the sensing step, each level judging circuit detects whether a memory cell connected to the selected word line has a threshold level more than the upper limit. In the re-erasing step, the erasing operations are carried out only to the memory cells having threshold levels more than the upper limit.

After the re-erasing operation, the sensing step is repeated once more, and when there exist memory cells having threshold levels more than the upper limit, the re-erasing operation is repeated. In this way, by repeating the sensing step and the re-erasing step, every memory cell has a threshold level within the object range.

Dropping values of the threshold levels in the re-erasing operation change according to a duration of the re-erasing operation. It is required that every memory cell does not have a threshold level less than the lower limit of the object range, therefore, the duration of the re-erasing operation is determined according to a width of the object range. Namely, the width of the object range can be narrower by shorting the duration of the re-erasing operation.

Memory cells connected to the selected word line are erased by the above erasing operation. The above erasing operation is repeated by selecting every word line, then, a whole erasing operation of the memory device is finished.

In the above description, the first erasing operation is carried out to the selected word line, however, the first erasing operation can be simultaneously carried out to the whole memory device, and then, the sensing step and the re-erasing step can be repeated to every word line.

From the above dscription, it is apparent that the upper limit of the object range is determined by the threshold level of the dummy cell. Therefore, the upper limit can be easily changed by changing the threshold level of the dummy cell.

Further, in the sensing operation, 5 V is applied to the bit line. This voltage is supplied from the voltage source of the flip-flop circuit. The content of the memory cell is read in the reading operation of this condition. However, since this reading condition is more similar to the writing condition than to the condition in that a lower voltage than 5 V is applied to the bit line, it is possible that a few electrons are injected into the floating gate in the reading operation. Therefore, this voltage is desired to be decreased. In order to decrease this voltage in the sensing operation, a lower voltage is supplied to the plus voltage source of the flip-flop circuit of FIG. 6 when the bit lines are charged up.

In the first embodiment, the erasing high voltage sources 8-1, 8-2, . . . are separately arranged at every source line. In this constitution, since many erasing high voltage sources are need to be included, the memory device has a problem that it become complicated. For example, a number of the source lines is 1024, a number of the erasing high voltage source is also 1024. In a second embodiment, this problem is improved.

Figure 9:
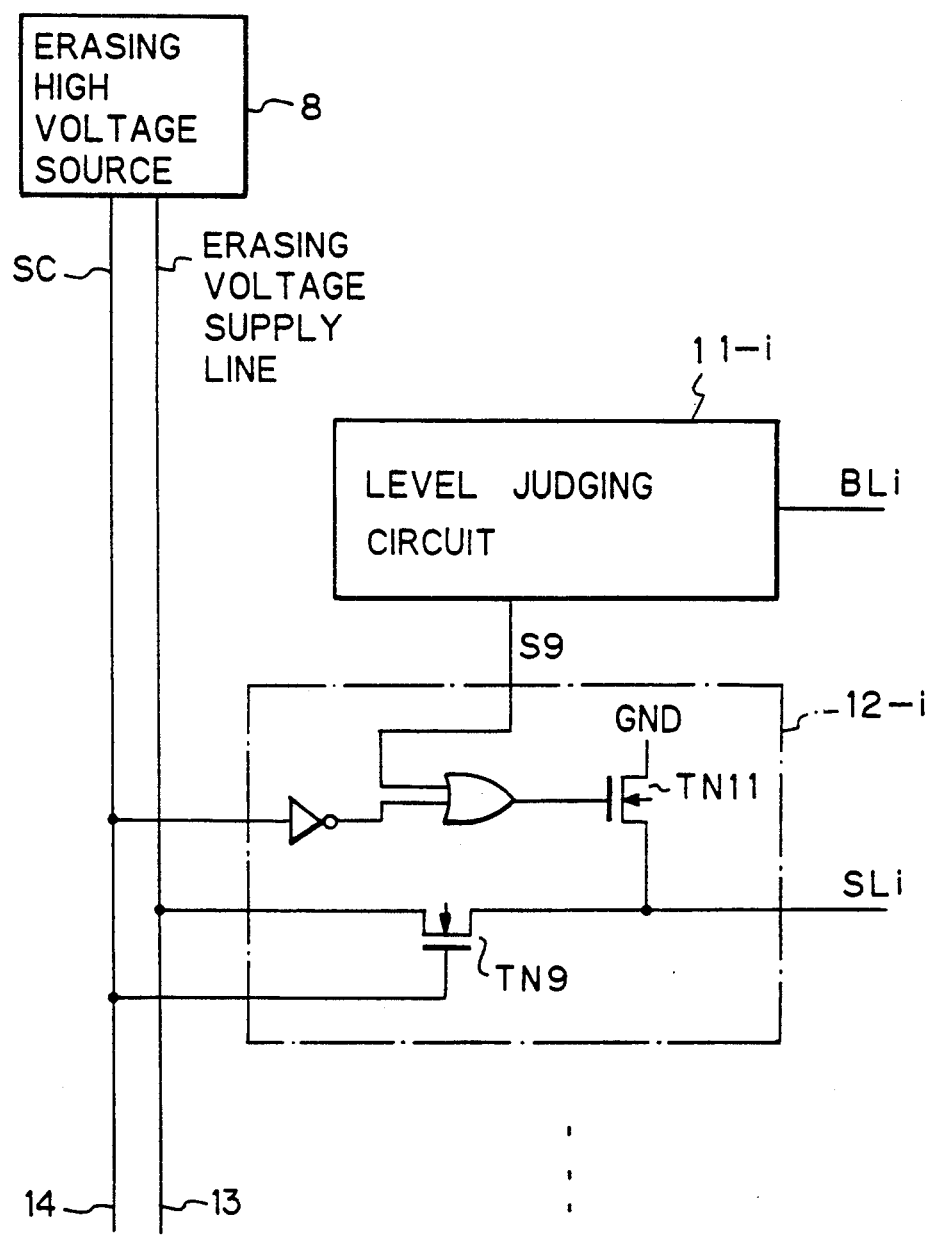
FIG. 9 is a circuit diagram showing a constitution of a source line switch of a second embodiment.

FIG. 9 is a circuit constitution of a level judging circuit 11-i, a source line switch circuit 12-i and a erasing high voltage source 8 of the second embodiment. As shown in FIG. 9, in this constitution, only one erasing high voltage source 8 is included, and an erasing high voltage is supplied to each source line switch circuit 12-i via an erasing voltage supply line 13.

Further, in the first embodiment, the transfer transistor TN9 is controlled by the signal S5 which is generated from the signal S9 of the second output node of the flip-flop circuit and the erasing signal SC. However, in this embodiment, TN9 is controlled only by the SC. When the ON resistance of TN9 is sufficiently larger than that of the reset transistor TN11, a potential of the source line becomes almost 0 V without turning TN9 OFF. The second embodiment has an advantage that the source line switch circuit becomes simple.

However, in the re-erasing operation of the second embodiment, when most selected memory cells are sufficiently erased, many TN11s turn ON, and a current flows from the erasing high voltage source 8 to the ground through many pairs of TN9s and TN11s. Therefore, in the second embodiment, it is required that a potential of the erasing voltage supply line 13 does not decrease due to the current flowing from the voltage source 8 to the ground. This requirement can be satisfied when a current supply ability of the erasing high voltage source 8 is sufficiently larger than a current through the transfer transistors TN9, and a voltage drop due to total resistance of the erasing voltage supply line.

For example, it is assumed that a number of the source lines are 1024, and 128 memory cells are connected to each source line. A cell capacity is about 1 fF/cell when a cell area is about 4 $\mu m^2$, therefore, a capacity of one source line is 128 fF. When a sheet resistivity of a source line is 50 ohm and the source line has a 0.5 $\mu m$ width and 2 m length, the total resistance of the source line is 25.6 kohm. Therefore, a time constant of the line is about 3 ns. Further, when 1024 level judging circuits are arranged, a length of the erasing high voltage supply line becomes 2 mm (2 m×1024), and the total resistance of this line becomes 200 ohm (0.5×2048 /5) when a sheet resistivity of the line is 0.5 ohm and a line width is 5 $\mu m$. In order to reduce the voltage drop due to this line resistance to less than 0.1 V, the total current is required to be 500 $\mu A$ (0.1/200). Therefore, 0.5 $\mu A$ can be carried at each source line. 3 $\mu s$ (128 fF×1 V /0.5 $\mu A$) is required to charge up the source line from the ground level to 12 V. This time is very larger than the time constant 3 ns, therefore, it is apparent that the resiatance of the source line is not important. Further, since the resistance of the high voltage supply line has a strict condition, a low resistance material such as an aluminum is required to form the high voltage supply line. Also, since the reset transistor TN11 carries only about 0.5.$\mu A$, the size of this reset transistor does not need to be large. Consequently, the transistors can be arranged in the narrow area in which the sense amplifiers are arranged. Of course, this condition is an example, and the memory devices of the present invention can be realized by many kinds of conditions.

In the first embodiment, each level judging circuit 11-i includes a flip-flop circuit as shown in FIG. 6. As known in a memory device technology, a sense amplifier can be realized by the flip-flop circuit. The sense amplifier is used to detect a potential of the selected bit line in the reading operation. A flash memory of the present invention also need to include sense amplifiers, therefore, functions of the level judging circuits can be replaced with the sense amplifiers. A second embodiment is a flash memory of this type.

Figure 10:
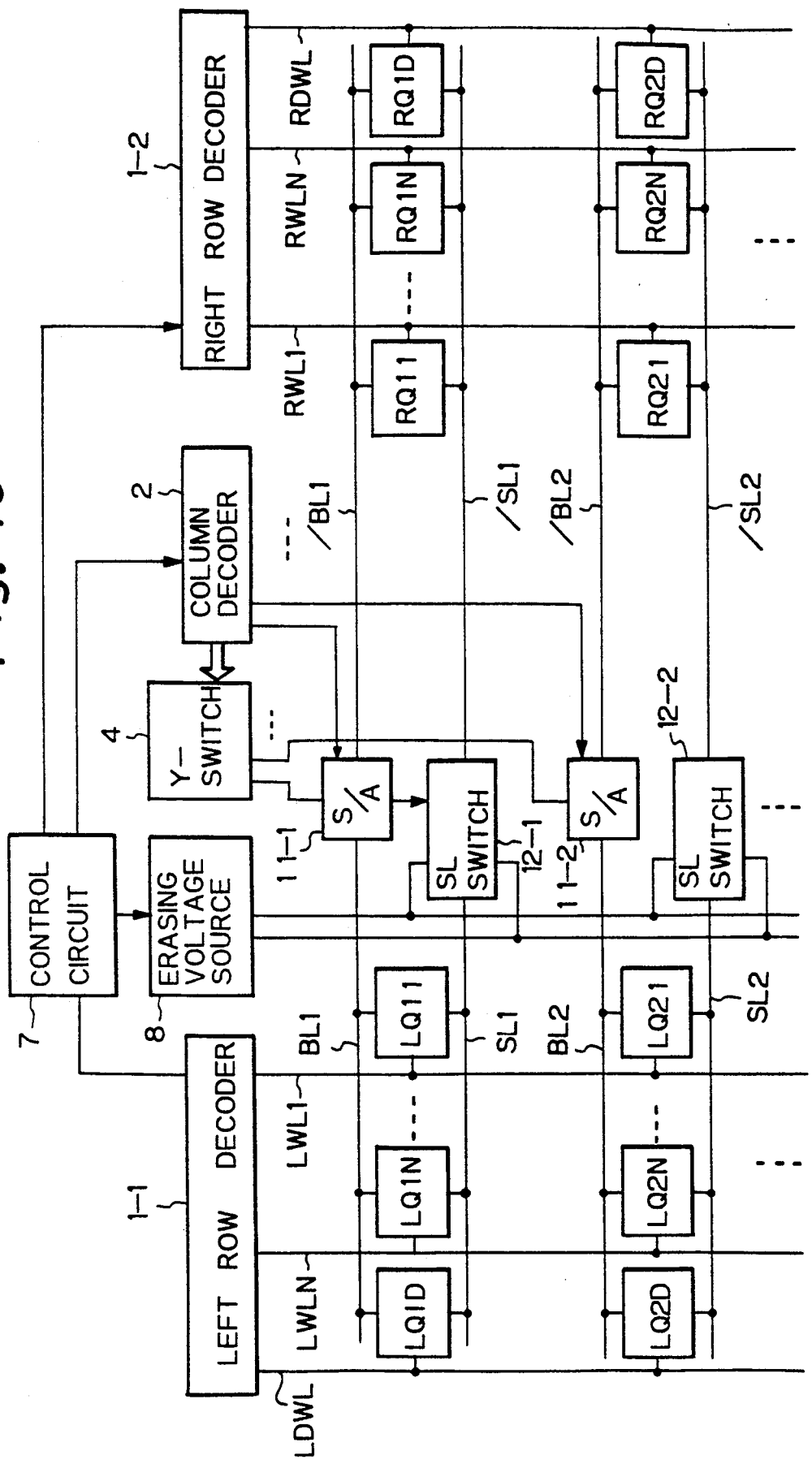
FIG. 10 is a block diagram showing a total constitution of a flash memory of a third embodiment.

FIG. 10 is a diagram showing a fundamental constitution of a flash memory of the third embodiment.

In FIG. 10, 1—1 designates a left row decoder, 1-2 designates a right row decoder, 2 designates a column decoder, 8 designates an erasing high voltage source, 11-i designates a sense amplifier, 12-i designates a source line switch, 4 designates a Y-switch array which is controlled to select outputs from the sense amplifiers by the column decoder 2, LWLi designates a word line in a left part, RWLi designates a word line in a right part, LDWL designates a dummy word line in the left part, RDWL designates a dummy word line in the right part, BLi and SLi respectively designate a bit line and a source line in the left part, and /BLi and /SLi respectively designate a bit line and a source line in the right part.

As shown in FIG. 10, this device is divided into a left part and a right part. Each pair of the left and right bit lines are connected to the sense amplifier 11-i, and each pair of the left and right source bit lines are connected to the source line switch 12-i. A constitution that sense amplifiers are respectively arranged at bit lines is well known in a conventional device. In one type of this constitution, outputs of the sense amplifiers are directly transfered to an output terminal. In this type, the column decoder is required to selectively control operations of the sense amplifiers. In another type, the sense amplifiers arranged at each bit line only amplifie a potential difference of the bit line, and a sense amplifier arranged at a common bit line detects a potential of the common bit line and outputs a detected result. In this type, the column decoder controls Y-switches in the same way of the convention device. The second embodiment is a flash memory of the first type to which the present invention is applied, however, the present invention can be applied to the second type. Therefore, the column decoder 2 controls the Y-switch array 4 and the Y-switch array 4 select outputs from the sense amplifiers 11-i. In this embodiment, the voltage applied to the selected bit line in the writing operation is selectively supplied from each sense amplifier 11-i, therefore, decoded signals from the column decoder 2 are respectively applied to the sense amplifiers 11-i.

Figure 11:
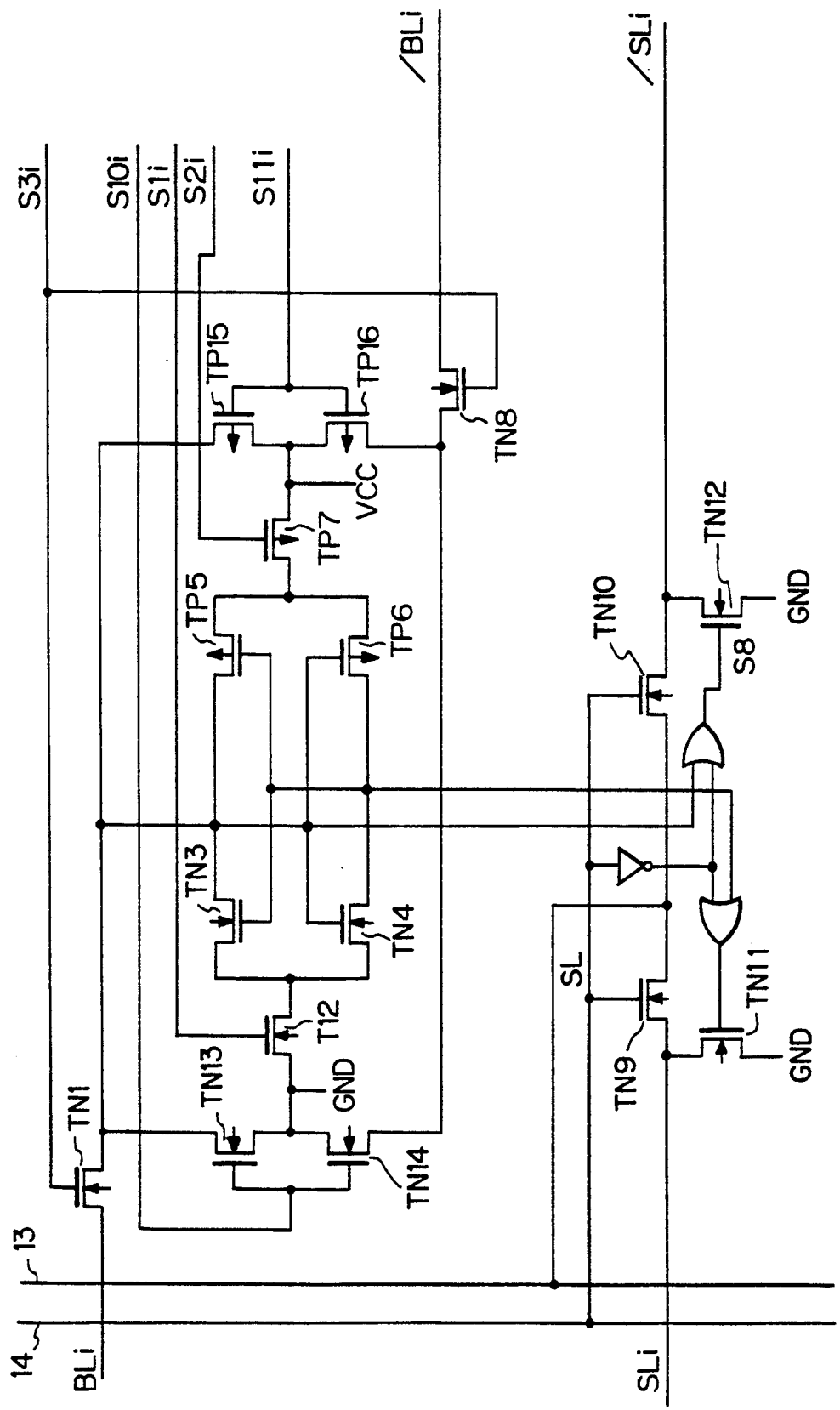
FIG. 11 is a circuit diagram of a level judging circuit and a source line switch circuit of FIG. 10.
Figure 12:
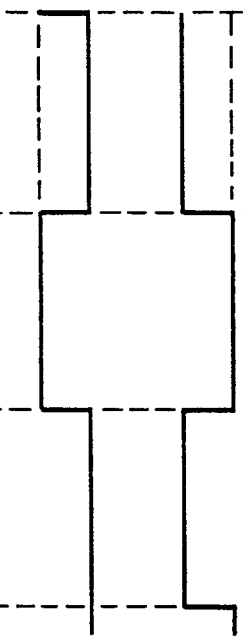
FIGS. 12A to 12F are time-charts showing control signals in a reading operation of the third embodiment.
Figure 13:
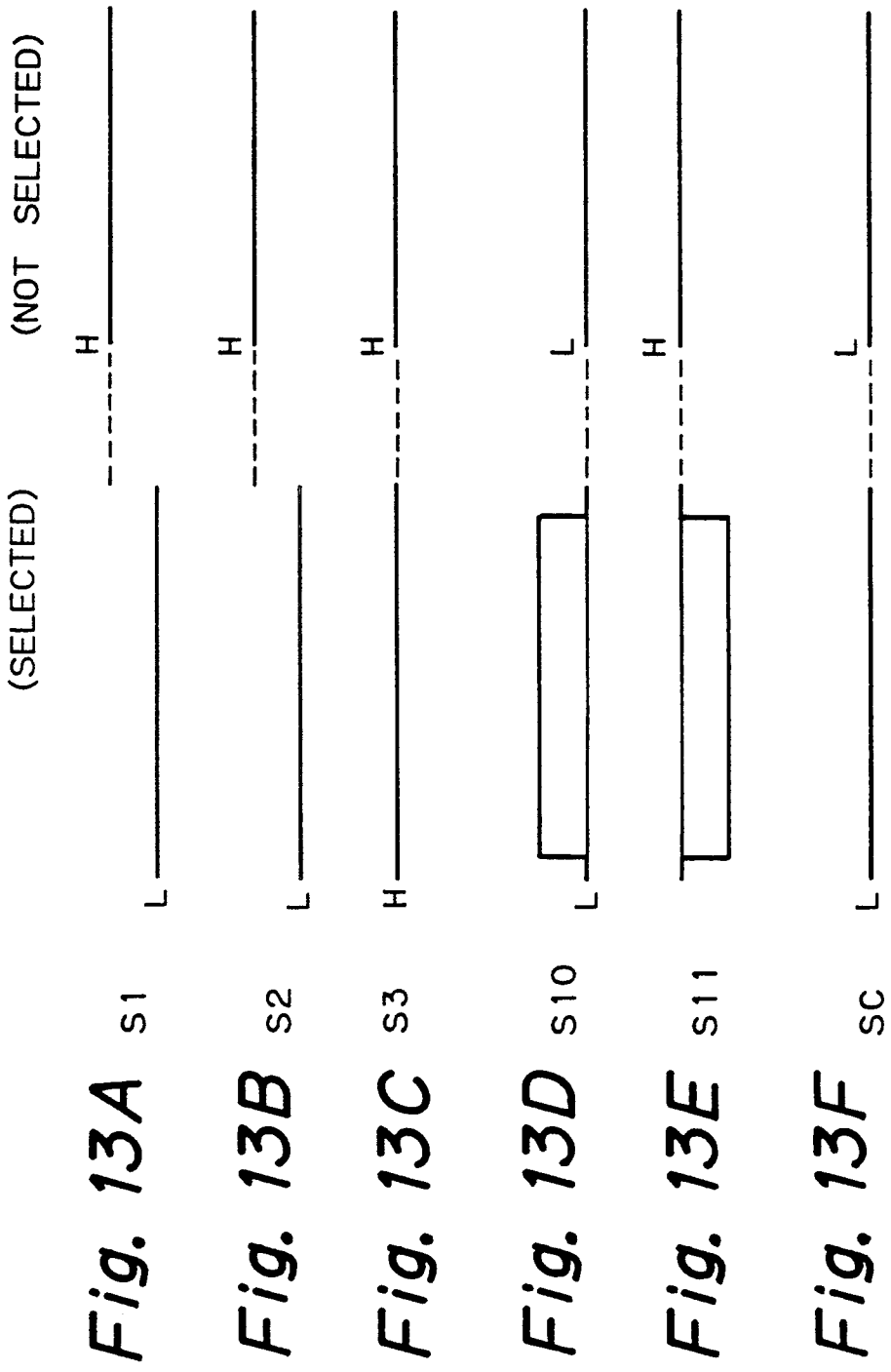
FIGS. 13A to 13F are time-charts showing control signals in a writing operation of the third embodiment.
Figure 14:
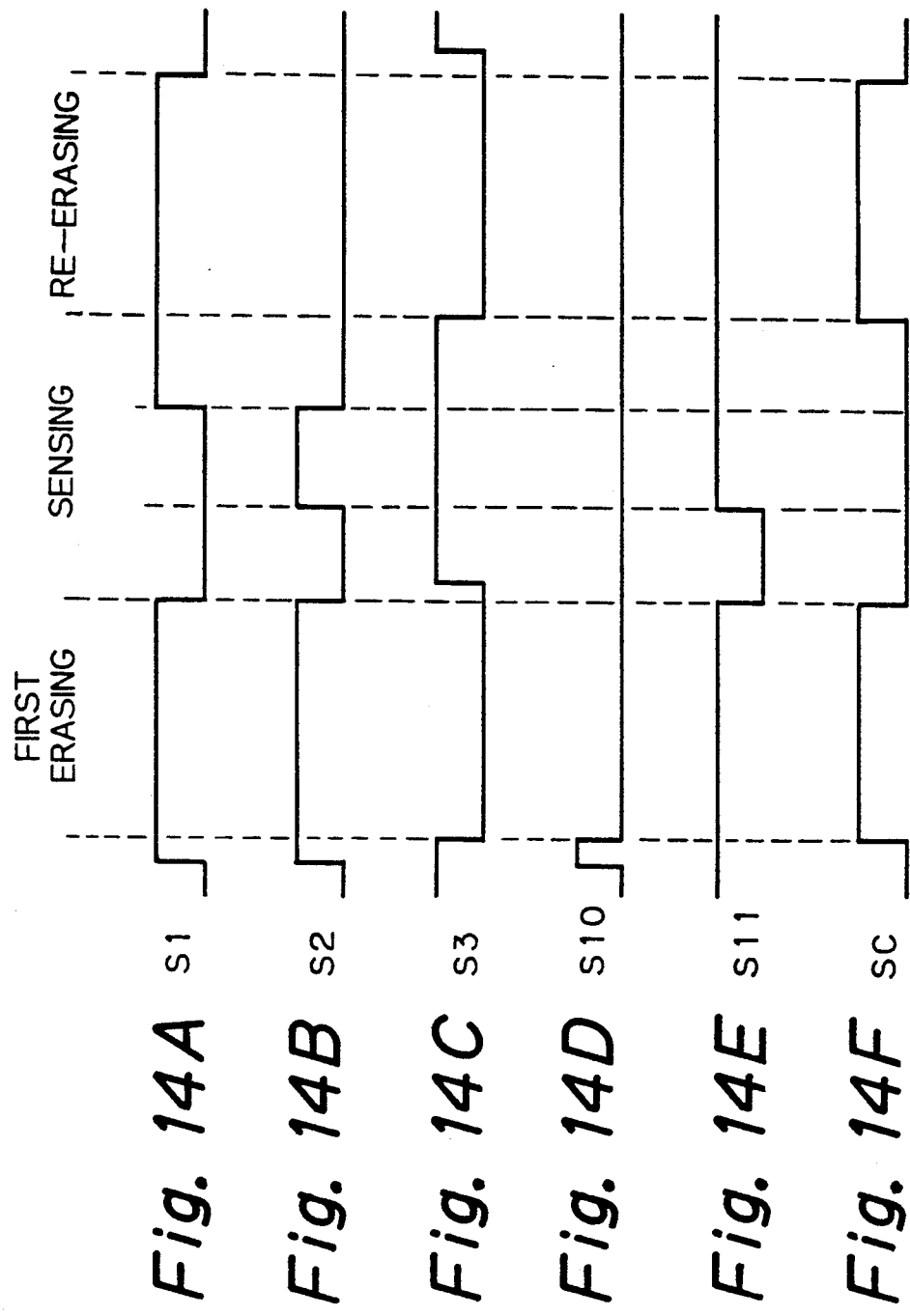
FIGS. 14A to 14F are time-charts showing control signals in an erasing operation of the third embodiment.

FIG. 11 is a circuit diagram of the sense amplifier and the source line switch of this embodiment.

As shown in FIG. 11, this circuit has a constitution similar to that of FIG. 6. In this circuit, a pair of two N-channel transistors TN13 and TN14 and a pair of two P-channel transistor TP15 and TP16 are respectively connected in serial between two output nodes of the flip-flop circuit. A control signal S10i is applied to two gates of TN13 and TN14, and a control signal S11i is applied to two gates of TP15 and TP16. The bit line BLi of FIG. 6 is also connected to the left side bit line, and the dummy bit line DBLi of FIG. 6 is connectd to the right side bit line /BLi. The dummy memory cell DQi of FIG. 6 corresponds to a right side dummy memory cell RQiD. This dummy memory cell RQiD works as a dummy memory cell when memory cells in the left part are selected. The left side dummy memory cell LQiD works as a dummy memory cell when memory cells in the right side are selected. In the source line switch 12-i, transfer transistor TN9 and a reset transistor TN11 are symmetrically arranged to the right side source line /SLi. The gate of a reset transistor TN12 is controlled by a signal S8 generated from the signal S9 of the first output node of the flip-flop circuit and the signal SC of the line 14. The control signals S1i, S2I, S3i, S10i and S11i are independently supplied from the column decoder 2, and these signals are different from those supplied to other level judging circuits. However, the signal SL supplied on a line 14 from the control circuit 7 via the erasing high voltage source 8 is commonly supplied.

The erasing operations of the circuit shown in FIG. 10 are almost same to those of the first and second embodiments. For example, when memory cells in the left part are selected in the sensing step, the left row decoder 1—1 applies 5 V to the selected word line and 0 V to another left side word lines and the left dummy word line, and the right row decoder 1-2 applies to 5 V to the right dummy word line and 0 V to every right word lines. This state is same to that of the first embodiment. When memory cells in the right side are selected, this circuit operates symmetrically. A selection of outputs of the sense amplifiers is controlled by the column decoder 2.

This embodiment is mainly different from the first and second embodiments in that two pairs of transistors are included, and the control signals are different for every level judging circuit. Now, these different points are explained.

As shown in FIG. 11, the sense amplifier further includes a pair of two N-channel transistors TN13 and TN14 serially connected between two output nodes of the flip-flop circuit and a pair of two P-channel transistors TP13 and TP14 serially connected between two output nodes of the flip-flop circuit. An intersection of TN13 and TN14 is connected to the ground, and a control signal S9 is applied to gates of TN13 and TN14.

An intersection of TP15 and TP16 is connected to the voltage source VCC, and a control signal S10 is applied to the gates of TP15 and TP16.

In the first and second embodiments, before starting the erasing operation, potentials of two output nodes of the flip-flop circuit becomes 0 V by setting S1 and S2 to 5 V. BY this, the N-channel transistor TN11 becomes OFF because S7 becomes 0 V. Further, when potentials of the bit lines to 5 V, potentials of two output nodes of the flip-flop circuit becomes 5 V by setting S1 and S2 to 0 V. However, channel resistors of TN3, TN4, TP5 and TP6 are high because these transistors are OFF when S1 and S2 are changed, therefore, potentials of two output nodes of the flip-flop circuit change slowly. These durations cannot be neglected. In the third embodiment, two N-channel transistors TN13 and TN14 turns ON by setting S10i to 5 V. In this way, the output nodes of the flip-flop circuit are connected to the ground via ON state channels, therefore, potentials of the output nodes quickly decrease to 0 V. In the same way, potentials of the output nodes quickly increase to VCC by setting S11i to 0 V. Therefore, in an operation of this embodiment, discharge process before the first and re-erasing erasing operations and a charge up process at the charging step are different from those of the first and second embodiments.

Further, in this embodiment, voltage applications to the bit lines in the reading operation and the writing operation are carried out by the sense amplifiers.

FIGS. 12A-12F, 13A-13F and 14A-14F respectively show time-charts of control signals of the reading operation, the writing operation and the erasing operation of this embodiment.

As shown in FIGS. 12A-12F, the reading operation is also composed of the charging step, the difference detecting step and the amplifying step. The signals S1, S2, S3 and SC of the selected bit line are same to those of the sensing step of FIG. 7A-7D. The signal S10 is always 0 V during the reading operation, and S11 is 0 V during the charging step and 5 V at other times. S1, S2, S3, S10, S11 and SC are respectively 0 V, 5 V, 5 V, 0 V, 0 V and 5 V. By these control signals, only a sense amplifier connected to the selected bit line is activated and outputs a read result. The output of the sense amplifier is also selected at the Y-switch array according to the column decoded signal.

In this way, the output of the sense amplifier is also selected at the Y-switch array, therefore, a modified constitution in which the signals of the selected bit line are applied to every sense amplifier and the outputs of the sense amplifiers are selected only at the Y-switch array can be available. In this modified constitution, signal lines of S1, S2, S3, S10 and S11 can be commonly used, however, since all bit lines except the selected one are charged up, more current flows.

As shown in FIGS. 13A-13F, the signals S1, S2, S3 and SC of the selected bit line are respectively 0 V, 0 V, 6 V and 0 V. The signals S10 and S11 are changed according to contents to write, namely, S10 is 6 V and S11 is 0 V when "0" is written, and S10 is 0 V and S11 is 6 V when "1" is written. S1, S2, S3, S10, S11 and SC except the selected bit line are respectively 5 V, 5 V, 5 V, 0 V, 5 V and 0 V. By these control signals, only a sense amplifier connected to the selected bit line outputs 6 V, and all other sense amplifiers output 0 V. 12 V is applied onto the selected word line by the left row decoder 1—1 or the right row decoder 1-2 and then the memory cell connected to the selected word line and bit line is written.

As shown in FIG. 14A-14F, in the erasing operation, the signals S1, S2, S3, S10 and S11 supplied to every sense amplifier are same, and S1, S2, S3 and SC are same as those in FIGS. 7A-7D. Consequently, only the signals S10 and S11 are explained.

S10 is 5 V only in a short duration which corresponds to the discharge process before the first erasing step and 0 V at all other times. S11 is 0 V only in a duration which corresponds to the charge up process and 5 V in all other times.

Before the first erasing operation, TN1, TN2, TP7, TN8, TN13, TN14, TP15 and TP16 turn OFF, and the flip-flop is cut off from the ground and the voltage source VCC. Then, TN13 and TN14 turn ON by setting S10 to 5 V.

By this, since two output nodes of the flip-flop circuit are connected to the ground via TN13 and TN14, TN11 and TN12 turn OFF. Then, the source lines SLi, /SLi are in a floating state. Since TN13 and TN14 are ON, these discharge the output nodes quickly. TN13 and TN14 immediately turn OFF after the output nodes are discharged.

When the bit lines are charged up in the charging step after the first erasing step, TN13 and TN14 turn OFF by setting S10 to 0 V, and TP15 and TP16 turn ON by setting S11 to 0 V. By this, the two output nodes of the flip-flop circuit are connected to the voltage source VCC via TP15 and TP16, therefore, S7 and S8 quickly become 5 V. Namely, the bit lines are quickly charged up. By this, TN11 and TN12 turn ON and then the source lines SLi, /SLi are grounded. TP15 and TP16 immediately turn OFF after the output nodes are charged up.

Figure 15:
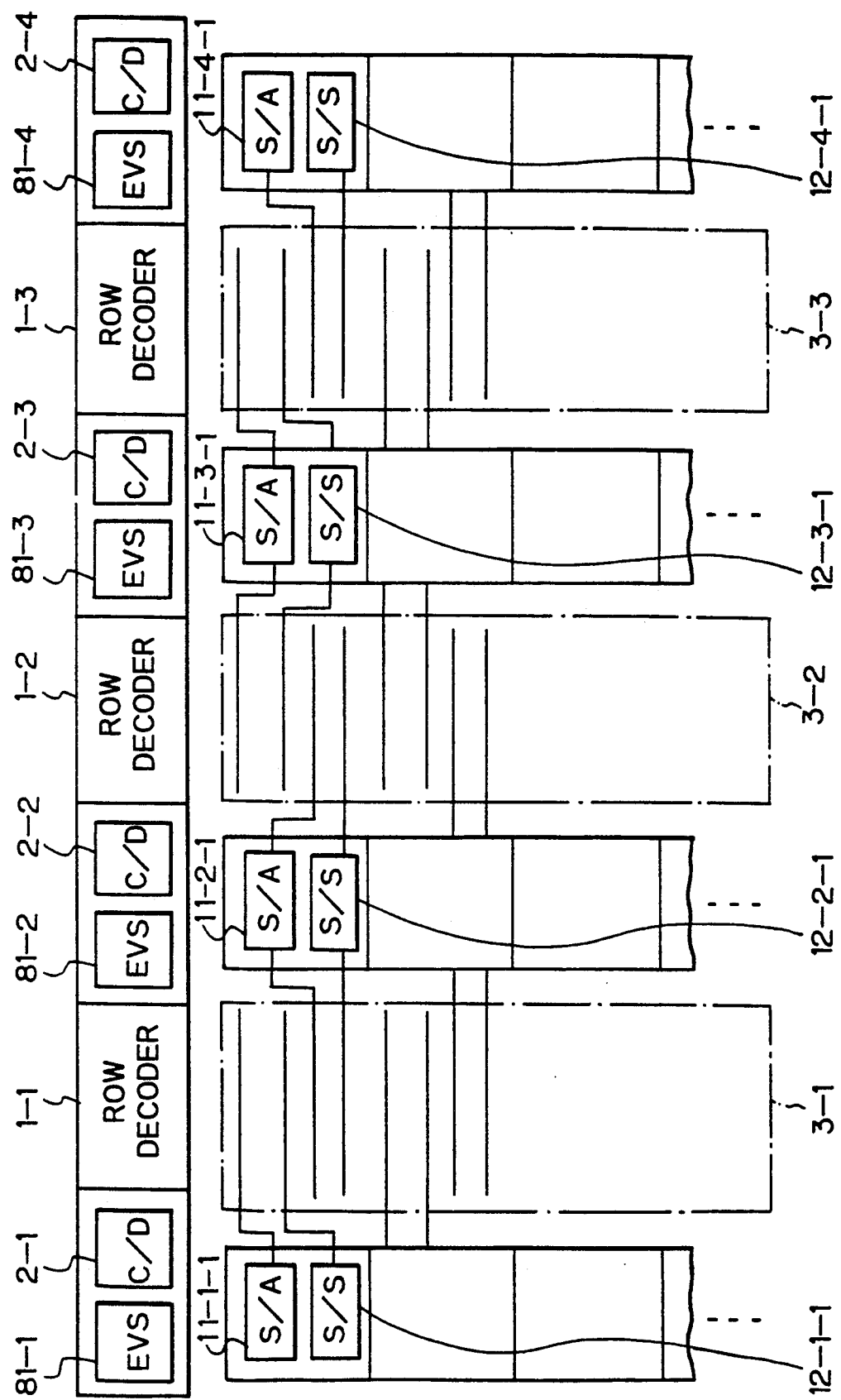
FIG. 15 is a diagram showing an arrangement of sense amplifiers and source line switches of a fourth embodiment.

FIG. 15 is a diagram showing an arrangement of every portion of a device of a fourth embodiment.

In FIG. 15, 1-i designates a row decoder, 2-i designates a column decoder, 3-i designates a matrix of memory cells, 11-j-i designates a sense amplifier, 12-j-i designates a source line switch and 81-i designates a erasing high voltage source.

In the embodiments described above, level judging circuit (sense amplifier) and a source line switch are arranged in a pitch of each pair of the bit line and the source line. It is apparent that a circuit scale of each pair of the level judging circuit and the source line switch is larger than that of each memory cell. Therefore, the devices shown in the first to third embodiments are difficult to produce with high integration.

In this embodiment, the sense amplifier and the source line switch pair are arranged in two pitches of each pair of the bit line and the source line. Therefore, the layout design of the device becomes easy, especially, a problem relating to a voltage proof can be avoided.

Figure 16:
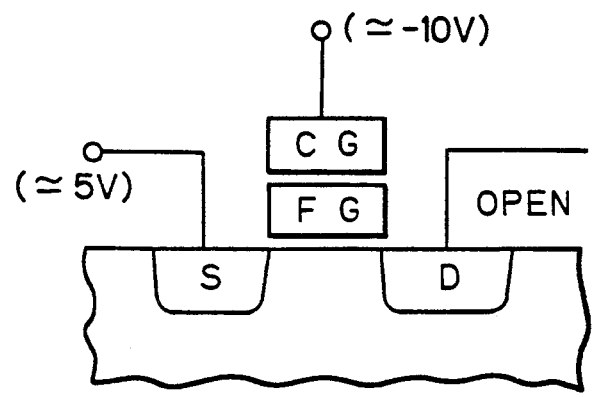
FIG. 16 is a diagram showing voltage conditions of an erasing operation in a fifth embodiment.

FIG. 16 is a diagram showing a condition of the erasing operation of the fifth embodiment. As shown in FIG. 16, a minus voltage about −10 V is applied to the control gate (word line), a voltage about 5 V of a normal voltage source is applied to the source (source line), and the drain (bit line) is opened in the erasing operation.

In the first to fourth embodiments, an erasing high voltage is commonly applied to every source line in the erasing operation. Therefore, transfer transistors having high voltages proofs must be arranged in arrangement pitches of the sense amplifiers, and a specific construction for a high voltage proof is required to realize these transistors. The row decoder has transistors having high voltage proofs because it applies high voltages to each word line in the writing operation. Therefore, when voltages shown in FIG. 16 are applied, high voltages are applied only to word lines and transistors having high voltage proofs do not need to be included in the sense amplifiers.

In a flash memory of this embodiment, the reading, writing and erasing operations are carried out in same ways of the embodiments described above except that voltages of the erasing operation are different.

Figure 17:
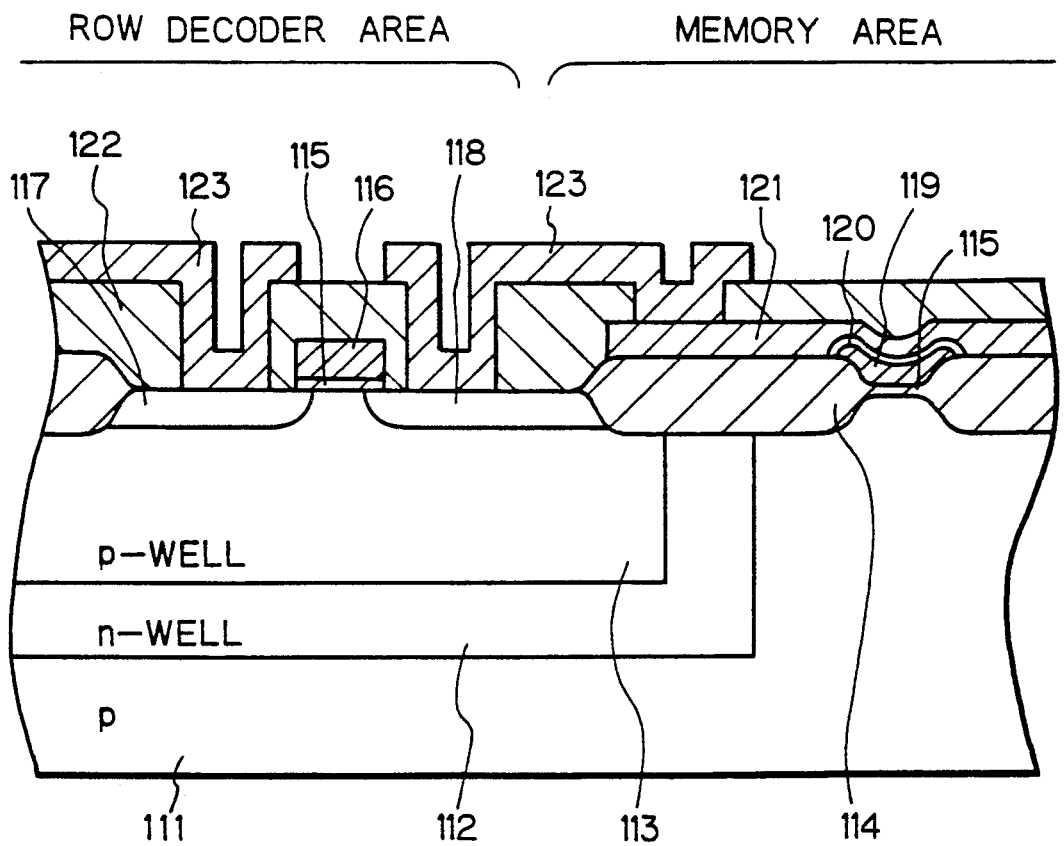
FIG. 17 is a diagram showing a construction of a memory area and a word decoder area of the fifth embodiment.

However, in a row decoder area, because minus voltages are applied to N-type diffusion regions, large currents flow between the N-type diffusion regions and a P-type substrate. Therefore, in order to overcome this problem, as shown in FIG. 17, the row decoder area must have a triple diffusion well construction composed of a P-type semiconductor substrate 111, an N-type well 112 and a P-type well 113. In FIG. 17, the left portion is a word decoder area and the right portion is a memory cell area. 114, 115, 119, 121 respectively designate a diffusion region, a channel region, a floating gate and a word line of the memory cell. 115, 116, 117 and 118 respectively designate a first diffusion region, a second diffusion region, a channel region and a gate region of a transistor in the row decoder.

In flash memories of the embodiments described above, when electrons are injected into the floating gate in the writing operation, hot carriers are generated by applying a voltage between the drain region and the source region and a part of the hot carriers are injected into the floating gate. However, in the flash memory of the present invention, another writing procedure is available because the source lines are independently arranged in parallel to the bit lines.

Figure 18:
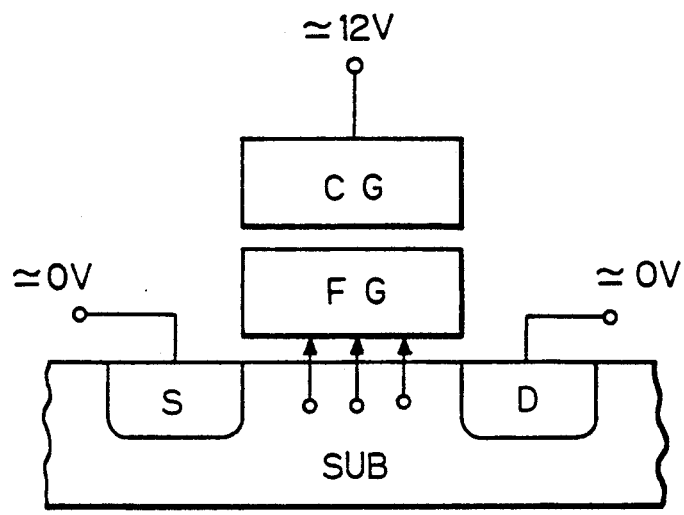
FIG. 18 is a diagram showing a voltage condition of a selected memory cell in an erasing operation in a sixth embodiment.

FIG. 18 is a diagram showing a voltage condition of the writing operation of a sixth embodiment. As shown in FIG. 18, a high voltage about 12 V is applied to the control gate (selected word line), and the drain region and the source region are grounded, namely, 0 V is applied to the selected bit line and the selected source line. 0 V is applied to another word lines and 6 V is applied to another bit lines and source lines. When the voltages shown in FIG. 18 are applied, no hot carrier flows between the drain region and the source region because 0 V is applied to them. However, a channel region between the drain region and the source region has a potential 0 V, and electrons are injected into the floating gate from the channel region through a gate oxide film due to a voltage between the channel region and the control gate. In another memory cells, because voltages between the channels and the control gates do not become so large, electrons are not injected into the floating gates.

Figure 19:
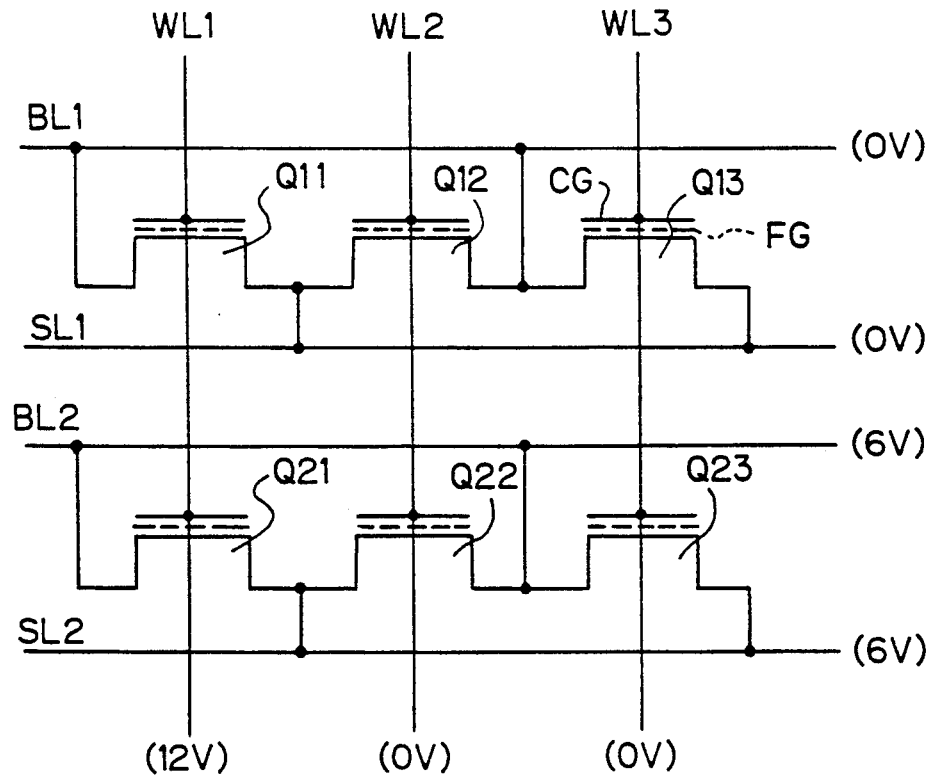
FIG. 19 is a diagram showing a voltage condition of every word line, bit line and source line in an erasing operation in the sixth embodiment.

FIG. 19 is a diagram explaining a writing operation of this embodiment. In this figure, only six memory cells are shown for convienience. As shown in FIG. 19, 12 V is applied to WL1, 0 V are applied to WL2 and WL3, 0 V is applied to a pair of BL1 and SL1, and 6 V is applied to a pair of BL2 and SL2. By applying these voltages, memory cell Q11 is selected, and the condition shown in FIG. 18 is realized in the selected memory cell. In other memory cells, voltages between the channel region and the control gates are smaller than that of FIG. 18, therefore, the writing operations are not carried out.

Figure 20:
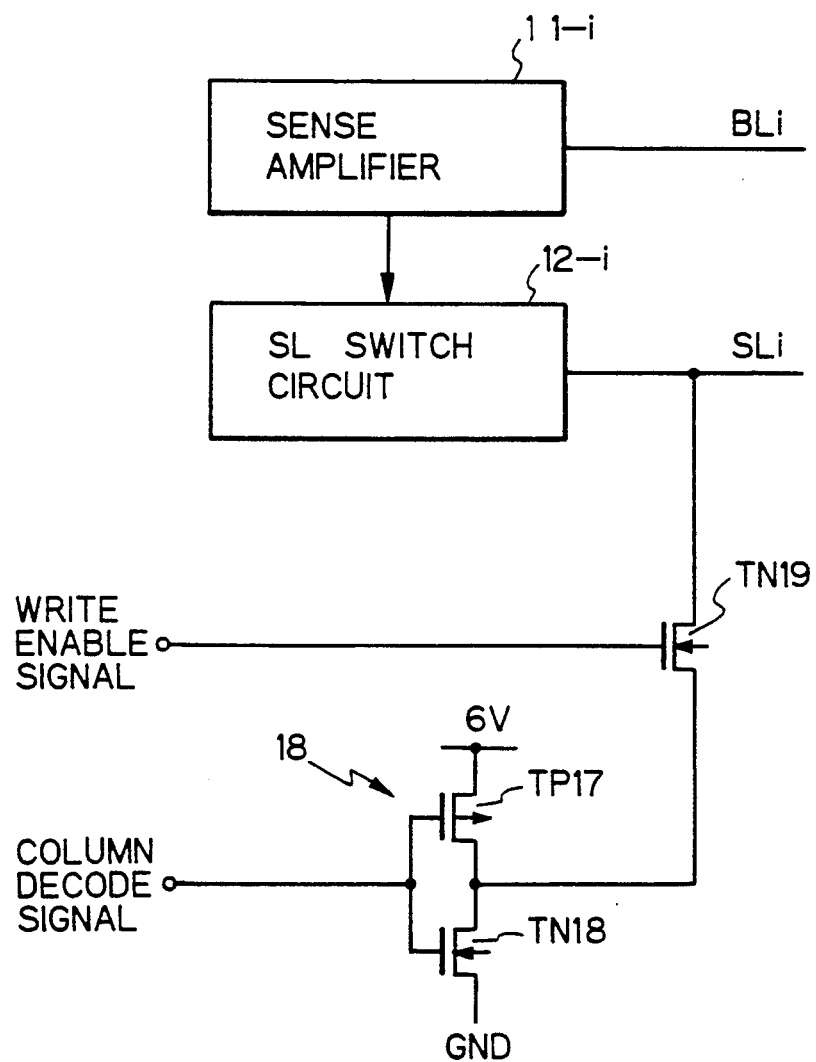
FIG. 20 is a circuit diagram of a level judging circuit and a source line switch circuit of the sixth embodiment.

A flash memory of this embodiment has a constitution similar to that of the third embodiment shown in FIG. 10 except that a circuit shown in FIG. 20 is added to each source line switch 12-i. In this embodiment, the voltages shown in FIG. 19 are required to be selectively applied to the source lines when the writing operation is carried out, and the circuit of FIG. 20 realizes this function.

As shown in FIG. 20, a switch 18 composed of a P-channel transistor TP17 and an N-channel transistor TN18 is connected to each source line SLi via a transfer transistor TN19. In the writing operation, every source line switch circuit 12-i is separated from the source line, and TN19 turns ON. By this, the switch 18 is connected to the source line. Gates of TP17 and TN18 are commonly connected, and a column decode signal S10i in FIG. 11 is applied to these gate. The switch 18 outputs 6 V or 0 V according to a signal applied to the gates, therefore, the voltages shown in FIG. 19 are selectively applied to the source lines.

In the writing operation in which a voltage is applied between the drain region and the source region, secondary electrons are generated by a current from the drain region to the source region, therefore, the ratio of electrons injected into the floating gate to the total current is very small. However, in the writing operation of this embodiment, a current directly corresponds to electrons injected into the floating gate through the gate insulation film (the Fowler Nordheim tunnel phenomenon), therefore, a consumed current is smaller than that of the above procedure.

In the sixth embodiment, a procedure that electrons are injected into the floating gate from the channel region by selectively applying same voltage to the drain region and the source region is adapted to the flash memory of the third embodiment, however, this procedure can be adapted to a flash memory in which source lines are independently arranged in parallel to bit lines and potentials of the source lines can be independently controlled.

As described above, an operation to inject electrons into a floating gate is called a writing operation, and an operation to withdraw electrons from the floating gate is called an erasing operation. In the conventional flash memory, since source lines are commonly connected, one operation of the above operations is required to be carried out by memory block. Since the writing operation is required to be independently carried out to each memory cell, the erasing operation is carried out by memory block. However, in the flash memory of the present invention, since two writing and erasing operations can be independently carried out, an operation to withdraw electrons from a floating gate can correspond to a writing operation, and an operation to inject electrons into the floating gate can correspond to an erasing operation.

FIGS. 21A-21C are diagrams respectively showing conditions of a writing operation, a reading operation and an erasing operation of a seventh embodiment. As shown in FIGS. 21A and 21C, the writing operation and the erasing operation of this embodiment correspond to those exchanged in a prior art.

As described above, when electrons are withdrawn from a floating gate, an over-erased problem can occur.

However, when electrons are injected into the floating gate, every state that electrons more than a predetermined value are injected can be accepted, namely, it has no upper limit. Therefore, in this embodiment, a over-erase problem does not occur in the erasing operation, and every memory cells can be simultaneously erased in a rough controlled erasing operation. Of course, in the writing operation, an over-written problem, that too many electrons are withdrawn, can occur. However, since the writing operation is respectively carried out to each memory cell, it is easy to control each threshold level of a written memory cell in a normal writing operation.

Many widely different embodiments of the present invention may be constructed without departing from the spirit and scope of the present invention, and it should be understood that the present invention is not limited to the specific embodiments described in this specification, except as defined in the appended claims.

I claim:

1. An electrically erasable nonvolatile semiconductor memory of a batch erasure type comprising:
   a plurality of word lines;
   a plurality of pairs of bit lines and source lines arranged perpendicular to said word lines;
   a matrix of memory cells arranged at intersections of said word lines and said pairs of said bit lines and said source lines, each of said memory cells including a floating gate, a control gate connected to one of said word lines, a first diffusion region connected to one of said bit lines and a second diffusion region connected to one of said source lines;
   a plurality of level judging circuits respectively arranged at said bit lines, each level judging circuit detects whether or not a selected memory cell connected to the selected word line turns ON when read voltages are applied to said selected memory cells and stores a switching signal corresponding to said detected result; and
   a plurality of source line switch circuits respectively arranged at said source lines, each of which circuits switches said source line to be connected to an erasing voltage source or to the ground according to said switching signal of the corresponding level judging circuit; wherein, an erasing operation is carried out with
   a first erasing process in which no memory cell is over-erased;
   a sensing process to detect and store a state of every selected memory cells in every level judging circuit;
   a re-erasing process to selectively apply erasing high voltages to source lines by being controlled with each source line switch circuit;
   a repeating process to repeat said sensing process and said re-erasing process until every selected memory cells connected to the selected word line turn ON when read voltages are applied to said selected memory cells; and
   a process to carry out said sensing process, said re-erasing process and said repeating process to every word line in a block of memory cells to which the erase operation being carried out.

2. A memory as set forth in claim 1, wherein, said erasing voltage source is compose of a plurality of erasing voltage source elements, and each of said erasing voltage source elements is arranged corresponding with said source line switch.

3. A memory as set forth in claim 1, said memory comprises one or more erasing voltage supply lines, and said source line switches are connected to one of said erasing voltage supply line.

4. A memory as set forth in claim 3, said source line switch includes a transfer gate transistor connected between said source line and said erasing voltage sipply line and a reset transistor connected between said source line and a ground, and an ON resistance of said transfer gate transistor is sufficiently larger than that of said reset transistor.

5. A memory as set forth in claim 1, wherein each of said level judging circuits comprises a flip-flop circuit and a dummy cell having a predetermined threshold level, said bit line and said dummy cell are respectively connected to two output nodes of said flip-flop circuit, and said switching signal can be obtained by detecting a difference of threshold levels between said selected memory cell and said dummy cell.

6. A memory as set forth in claim 5, wherein said level judging circuits are commonly use as sense amplifiers in a read operation.

7. A memory as set forth in claim 6, wherein said sense amplifiers are independently controllable, and voltage applications to bit lines in a writing operation are carried out by said sense amplifiers.

8. A memory as set forth in claim 6, wherein pairs of said sense amplifier and said source line switch circuit are arranged in both sides of said matrix of memory cells, and pairs of said bit line and said source line are mutually connected to said pairs of said sense amplifiers and said source line switches.

9. A memory as set forth in claim 1, wherein a minus voltage is applied to said control gate of each memory cell in an erasing operation.

10. A memory as set forth in claim 1, wherein, in a writing operation,
    a first voltage is applied to a selected word line;
    a second voltage is applied other word lines except said selected word line;
    said second voltage is applied to a selected bit line and a selected source line;
    a third voltage is applied to other bit lines and source lines except said selected bit line and said selected source line; and
    said third voltage is between said first voltage and said second voltage.

11. An electrically erasable nonvolatile semiconductor memory of a batch erasure type comprising:
    a plurality of word lines;
    a plurality of pairs of bit lines and source lines arranged perpendicular to said word lines;
    a matrix of memory cells arranged at intersections of said word lines and said pairs of said bit lines and said source lines, each of said memory cells including a floating gate, a control gate connected to one of said word lines, a first diffusion region connected to one of said bit lines and a second diffusion region connected to one of said source lines;
    a plurality of level judging circuits respectively arranged at said bit lines, each level judging circuit detects whether or not a selected memory cell connected to the selected word line turns ON when read voltages are applied to said selected memory cells and stores a switching signal corresponding to said detected result; and a plurality of source line switch circuits respectively arranged at said source lines, each of which circuits switches said source line to be connected to an erasing voltage source or to the ground according to said switching signal of the corresponding level judging circuit; wherein, a writing operation is carried out with a first writing process in which electrons are injected into said floating gate without no memory cell is over a predetermined level;

a sensing process to detect and store a state of every selected memory cells in every level judging circuit;

a re-writing process to selectively apply high voltages to source lines by being controlled with each source line switch circuit;

a repeating process to repeat said sensing process and said re-wrising process until every selected memory cells connected to the selected word line turn ON when read voltages are applied to said selected memory cells; and a process to carry out said sensing process, said re-erasing process and said repeating process to every word line in a block of memory cells to which the erase operation being carried out, and in an erasing operation, electrons are injected into said floating gate.

* * * * *